(12) United States Patent  
Ariyoshi et al.

(10) Patent No.: US 9,200,757 B2  
(45) Date of Patent: Dec. 1, 2015

(54) LIGHT SOURCE MODULE AND LIGHTING DEVICE HAVING THE SAME

(71) Applicant: SAMSUNG ELECTRONICS CO., LTD., Suwon-si, Gyeonggi-do (KR)

(72) Inventors: Tetsuo Ariyoshi, Suwon-si (KR); Jong Pil Won, Yongin-si (KR); Jun Ho Jung, Suwon-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 118 days.

(21) Appl. No.: 14/141,398

(22) Filed: Dec. 26, 2013

(65) Prior Publication Data

US 2015/0003053 A1    Jan. 1, 2015

(30) Foreign Application Priority Data

Jun. 27, 2013  (KR) .................. 10-2013-0074508

(51) Int. Cl.
*F21K 99/00* (2010.01)
*F21V 23/04* (2006.01)

(52) U.S. Cl.
CPC . *F21K 9/17* (2013.01); *F21K 9/175* (2013.01); *F21K 9/50* (2013.01); *F21V 23/0471* (2013.01)

(58) Field of Classification Search
CPC .............. F21S 2/00; F21K 9/17; F21K 9/175; F21K 9/50; F21V 3/02; F21V 5/047; F21V 23/0471
See application file for complete search history.

(56) References Cited

U.S. PATENT DOCUMENTS

2011/0267814 A1    11/2011    Moon et al.
2012/0155072 A1     6/2012    Chang

FOREIGN PATENT DOCUMENTS

| JP | 2012-074248 A | 4/2012 |
| JP | 2012-079610 A | 4/2012 |
| JP | 2013-038020 A | 2/2013 |
| KR | 2009-0120885 A | 11/2009 |
| KR | 2011-0054677 A | 5/2011 |
| KR | 2011-0089613 A | 8/2011 |
| KR | 20-0462518 Y1 | 9/2012 |
| KR | 2012-0117146 A | 10/2012 |
| KR | 2012-0121985 A | 11/2012 |

*Primary Examiner* — Mary Ellen Bowman  
(74) *Attorney, Agent, or Firm* — McDermott Will & Emery LLP

(57) ABSTRACT

A light source module includes a substrate, a plurality of light emitting devices disposed along a line on the substrate, and a lens. The lens extends in a long-axis direction in which the plurality of light emitting devices are aligned to cover the substrate and the plurality of light emitting devices, and has end sides opened at opposing ends of the lens in the long-axis direction. The lens has a first surface to which light from the plurality of light emitting devices is made incident, and a second surface allowing light made incident through the first surface to be radiated outwardly. The lens has a variable thickness, measured as a distance between the first surface and the second surface, in a cross-section of the lens along a plane orthogonal to the long-axis direction.

17 Claims, 28 Drawing Sheets

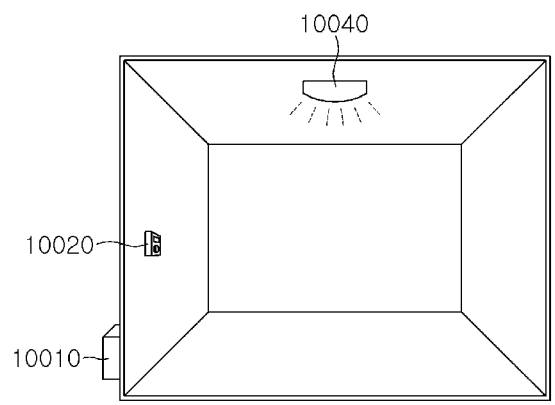
FIG. 29
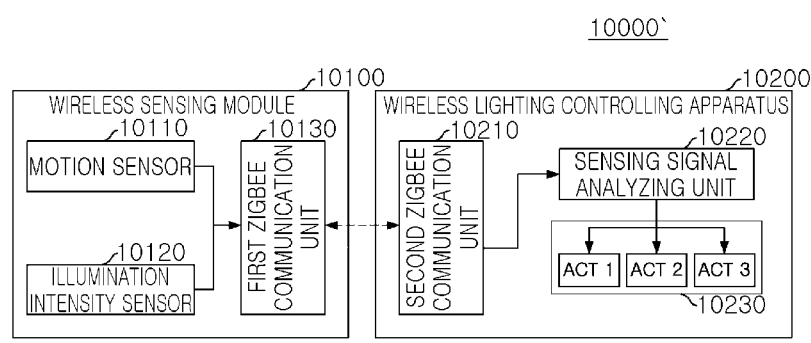
FIG. 30
| CHANNEL INFORMATION (CH) | WIRELESS NETWORK ID INFORMATION (PAN_ID) | DEVICE ADDRESS (Ded_Add) | SENSING DATA (ILLUMINATION INTENSITY VALUE, MOTION VALUE) |
|---|---|---|---|
FIG. 31

LIGHT SOURCE MODULE AND LIGHTING DEVICE HAVING THE SAME

CROSS-REFERENCE TO RELATED APPLICATION

This application claims the benefit of Korean Patent Application No. 10-2013-0074508 filed on Jun. 27, 2013, with the Korean Intellectual Property Office, the disclosure of which is incorporated herein by reference.

TECHNICAL FIELD

The present application relates to a light source module and a lighting device having the same.

DESCRIPTION OF RELATED ART

Fluorescent lamps are currently being extensively used at general lighting devices. However, fluorescent-type LED lamps which employ light emitting diodes (LEDs) that consume a relatively small amount of power and have a relatively long lifespan are increasingly being used.

However, when an LED lamp is installed in a lighting fixture designed to function using a conventional fluorescent lamp, a distance to which light is irradiated by the lighting fixture may be reduced relative to distance to which light is irradiated by a similar lighting fixture having a fluorescent lamp. This is because a fluorescent lamp uniformly emits light in all directions (360 degrees), while a conventional LED lamp typically only emits light within an arc of about 130 degrees to 140 degrees, making it difficult to replace existing fluorescent lamps with LED lamps.

SUMMARY

Thus, in the art, a method for increasing a light distribution angle of an LED lamp to 180 degrees or beyond and allowing an LED lamp to irradiate light within a range as wide as that of the conventional fluorescent lamp when the LED lamp is used in a lighting fixture is needed.

However, objects of the present application are not limited thereto and objects and effects that may be recognized from technical solutions or embodiments described hereinafter may also be included although not explicitly mentioned.

According to an aspect of the present application, there is provided a light source module including: a substrate; a plurality of light emitting devices disposed along a line on the substrate; and a lens extending in a long-axis direction in which the plurality of light emitting devices are aligned, to cover the substrate and the plurality of light emitting devices, and having end sides opened at opposing ends of the lens in the long-axis direction, wherein the lens has a first surface to which light from the plurality of light emitting devices is made incident and a second surface allowing light made incident through the first surface to be radiated outwardly, and wherein the lens has a variable thickness, measured as a distance between the first surface and the second surface, in a cross-section of the lens along a plane orthogonal to the long-axis direction.

The thickness of the lens in the cross-section of the lens along a plane orthogonal to the long-axis direction decreases from a center of the lens toward both lateral sides of the lens.

The thickness in the center of the lens may be greater than the thickness in both lateral sides thereof by n times where $1 < n \leq 2$.

The lens may be shaped such that both lateral sides thereof are parallel in the long-axis direction along which the plurality of light emitting devices are aligned, and portions of the lens connecting both lateral sides have a concave first surface and a convex second surface.

The lens may have a an arch-like cross-sectional shape, and the shape of the first surface may satisfy the following condition: Length of R is decreased as θ is increased within a range of θ>0°, where an intersection point of an optical axis of each light emitting device and a light emitting surface of the light emitting device is defined as a reference point 'O', 'R' is a straight line connecting the reference point and a certain point of the first surface, and θ is an angle between the straight line 'R' and the optical axis.

The lens may have a concavo-convex structure formed on at least any one of the first surface and the second surface.

The lens may be formed of a material obtained by mixing a light dispersion material contained in a resin material. The light dispersion material may be contained in the amount of 3% to 15%.

Each light emitting device may include a light emitting laminate including a first conductivity-type semiconductor layer, an active layer, and a second conductivity-type semiconductor layer, and first and second electrodes electrically connected to the first and second conductivity-type semiconductor layers, respectively, and the first electrode may include a conductive via connected to the first conductivity-type semiconductor layer through the second conductivity-type semiconductor layer and the active layer.

Each lighting device may include a plurality of nano-light emitting structures and a filler material filling spaces between the plurality of nano-light emitting structures, and each nano-light emitting structure may include a nano-core as a first conductivity-type semiconductor layer and an active layer and a second conductivity-type semiconductor layer as shell layers covering the nano-core.

Each lighting device may emit white light by combining a yellow, green, red, or orange phosphor with a blue LED, and a color rendering index (CRI) of white light ranges from a sodium-vapor lamp (CRI: 40) to a sunlight level (CRI: 100).

Each light emitting device may emit white light by combining yellow, green, or red phosphors to a blue LED, and the emitted white light may be positioned in a segment linking (x, y) coordinates (0.4476, 0.4074), (0.3484, 0.3516), (0.3101, 0.3162), (0.3128, 0.3292), (0.3333, 0.3333) of a CIE 1931 chromaticity diagram, or may be positioned in a region surrounded by a spectrum of black body radiation, and a color temperature of white light ranges from 2000K to 20000K.

According to another aspect of the present application, there is provided a lighting device including: a light source module including a substrate, a plurality of light emitting devices aligned on the substrate, and a lens extending in a long-axis direction in which the plurality of light emitting devices are aligned, wherein the lens covers the substrate and the plurality of light emitting devices and has end sides that are opened at ends of the lens in the long-axis direction; a body unit to which the light source module is fixed; and terminal units provided in two end portions of the body unit and configured to receive externally supplied power, wherein the lens has a first surface to which light from the plurality of light emitting devices is made incident and a second surface allowing light made incident through the first surface to be radiated outwardly, and wherein the lens has a variable thickness, measured as a distance between the first surface and the second surface, in a cross-section of the lens along a plane orthogonal to the long-axis direction.

The thickness of the lens in the cross-section of the lens along the plane orthogonal to the long-axis direction may decrease from a center of the lens toward both lateral sides of the lens.

The body unit may have stoppage recesses for detachably fastening the lens, and the stoppage recesses may be formed on one surface of the body unit to which the light source module is fixed.

The lighting device may further include a cover unit in which the body unit is insertedly fixed.

The cover unit may have a plurality of guides protruding from an inner surface of the cover unit to contact with the body unit, and the plurality of guides may be slidably inserted into guide recesses formed on an outer surface of the body unit.

The cover unit may have a cross-section having a circular shape and may extend in the long-axis direction of the light source module and the body unit to accommodate the light source module and the body unit therein.

The lighting device may further include a cover unit having a semi-circular cross-section and extending in the long-axis direction of the light source module and the body unit, and the cover unit may be configured to be fixed to the body unit and to cover the body unit The cover unit may include a plurality of heat dissipation slits or heat dissipation holes formed in portions of the cover unit facing the body unit and penetrating through the cover unit.

In a further aspect of the present application, a light source module includes: a substrate; a plurality of light emitting devices aligned on the substrate; and a lens extending in a long-axis direction in which the plurality of light emitting devices are aligned, to cover the substrate and the plurality of light emitting devices, wherein the lens has cross-section taken along a plane orthogonal to the long-axis direction including: two lateral sides that are parallel to each other and disposed on opposite sides of the aligned plurality of light emitting devices; and an arched portion connecting the two lateral sides and having a concave inner surface facing the plurality of light emitting devices, wherein the concave inner surface is disposed at a distance R, from a central point on a surface of a light emitting device facing the inner surface, that decreases from a center of the arched portion towards each of the two lateral sides.

The arched portion of the lens may have a convex outer surface facing away from the plurality of light emitting devices, and a thickness of the arched portion may decrease from the center of the arched portion towards each of the two lateral sides.

The lens may further include a concavo-convex structure formed on at least one of the concave inner surface and the convex outer surface.

BRIEF DESCRIPTION OF THE DRAWINGS

The above and other aspects, features and other advantages of the present application will be more clearly understood from the following detailed description taken in conjunction with the accompanying drawings, in which:

FIG. 29 is a view schematically illustrating the way in which the lighting system illustrated of FIG. 26 is used;

FIG. 30 is a block diagram of a lighting system according to another exemplary embodiment of the present application;

FIG. 31 is a view illustrating a format of a ZigBee signal according to an exemplary embodiment of the present application;

DETAILED DESCRIPTION OF THE PREFERRED EMBODIMENT

Figure 1:
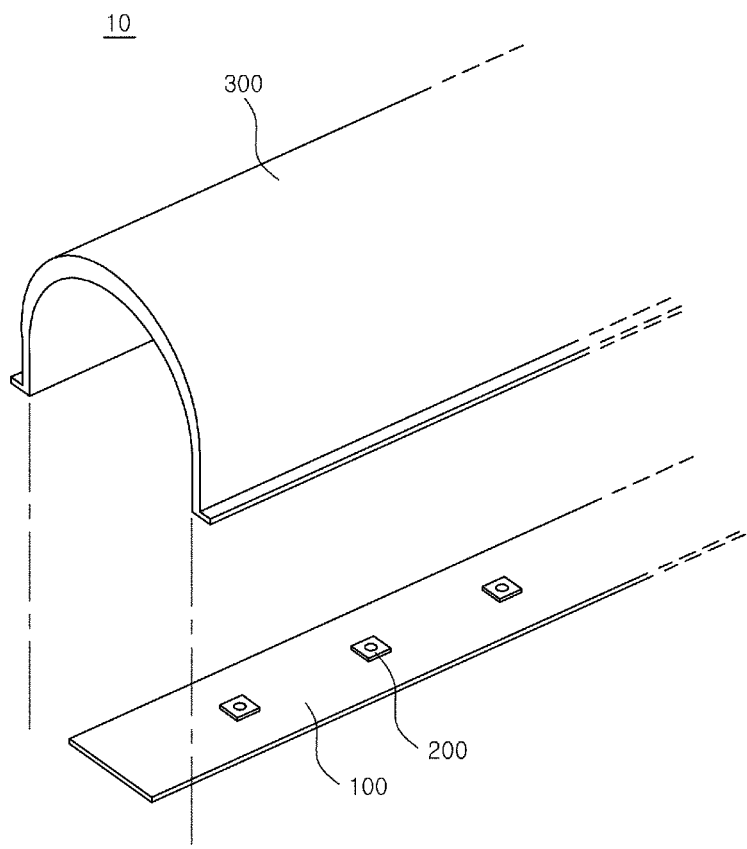
FIG. 1 is a perspective view schematically illustrating a light source module according to an exemplary embodiment of the present application.

Hereinafter, embodiments of the present inventive concepts will be described in detail with reference to the accompanying drawings. The inventive concepts may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like components.

A light source module according to an exemplary embodiment of the present application will be described with reference to FIGS. 1, 2A, and 2B. FIG. 1 is a perspective view schematically illustrating a light source module according to an exemplary embodiment of the present application, and FIGS. 2A and 2B respectively are a length-wise cross-sectional view and a front cross-wise cross-sectional view schematically illustrating the light source module of FIG. 1.

Figure 2A:
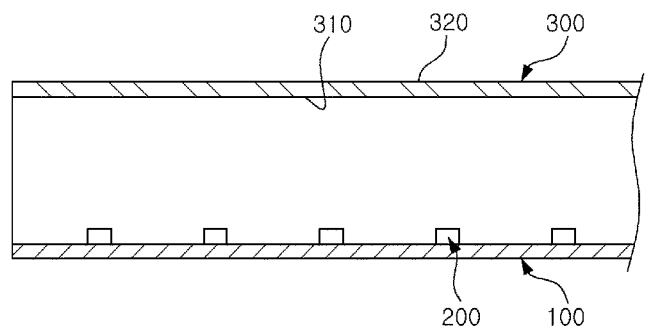
FIGS. 2A and 2B are a side cross-sectional view and a front view schematically illustrating the light source module of FIG. 1.
Figure 2B:
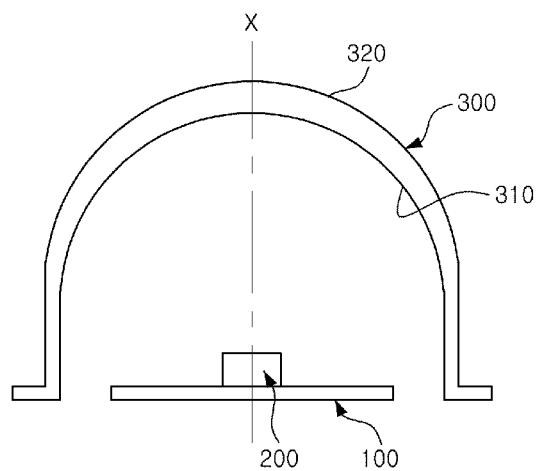

Referring to FIGS. 1, 2A, and 2B, a light source module 10 according to an exemplary embodiment of the present inventive concepts may include a substrate 100, a plurality of light emitting devices 200, and a lens 300.

The substrate 100 may have a bar-type plate structure extending in a length direction (or a longer-axis direction). A plurality of light emitting devices 200 may be mounted on an upper surface of the substrate 100 and aligned in the length direction of the substrate 100. The substrate 100 and the plurality of light emitting devices 200 may be covered by the lens 300 extending in a length direction to correspond to the substrate 100.

The substrate 100 may be a general FR4-type PCB and may be made of an organic resin material containing epoxy, triazine, silicon, polyimide, or the like, or any other organic resin material, may be made of a ceramic material such as silicon nitride, AlN, $Al_2O_3$, or the like, or may be made of metal or a metal compound. The substrate 100 may include a metal-core printed circuit board (MCPCB), a metal copper clad laminate (MCCL), or the like.

Hereinafter, various substrate structures that may be employed in the present embodiment will be described.

Figure 3:
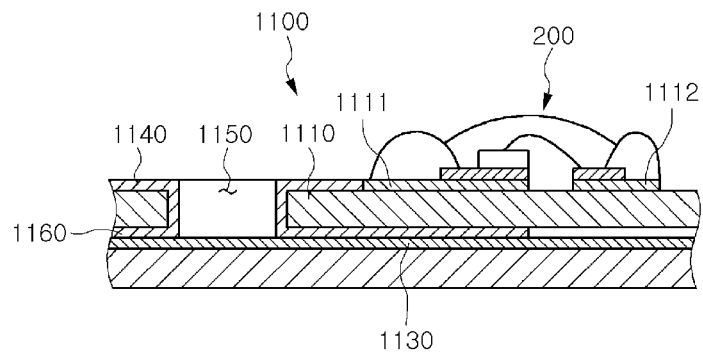
FIG. 3 is a cross-sectional view schematically illustrating an example of a substrate employable in the light source module of FIG. 1.

As illustrated in FIG. 3, a substrate 1100 may include an insulating substrate 1110 including predetermined circuit patterns 1111 and 1112 formed on one surface thereof, an upper thermal diffusion plate 1140 formed on the insulating substrate 1110 such that the upper thermal diffusion plate 1140 is in contact with the circuit patterns 1111 and 1112, and dissipating heat generated by the light emitting device 200, and a lower thermal diffusion plate 1160 formed on the other surface of the insulating substrate 1110 and transmitting heat, transmitted from the upper thermal diffusion plate 1140, outwardly. The upper thermal diffusion plate 1140 and the lower thermal diffusion plate 1160 may be connected by at least one through hole 1150 that penetrates through the insulating substrate 1110 and has plated inner walls, so as to be conduct heat therebetween.

In the insulating substrate 1110, the circuit patterns 1111 and 1112 may be formed by cladding a ceramic with copper or epoxy resin-based FR4 and performing an etching process thereon. An insulating thin film 1130 may be formed by coating an insulating material on a lower surface of the substrate 1110.

Figure 4:
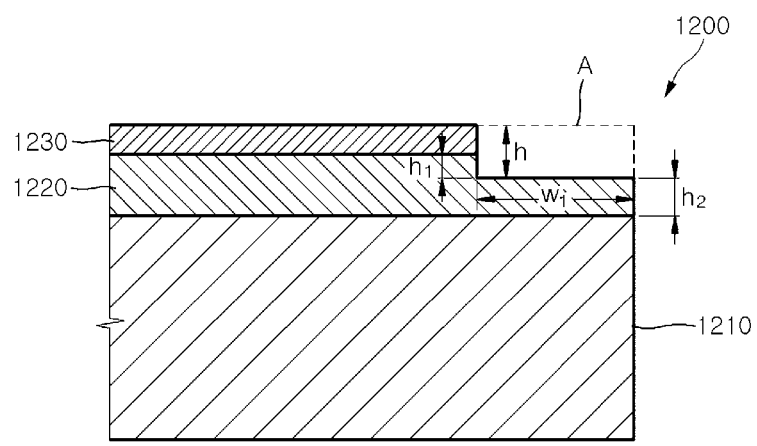
FIG. 4 is a cross-sectional view schematically illustrating another example of the substrate.

FIG. 4 illustrates another example of a substrate. As illustrated in FIG. 4, a substrate 1200 includes a first metal layer 1210, an insulating layer 1220 formed on the first metal layer 1210, and a second metal layer 1230 formed on the insulating layer 1220. A step region 'A' allowing the insulating layer 1220 to be exposed may be formed in at least one end portion of the substrate 1200.

The first metal layer 1210 may be made of a material having excellent exothermic characteristics. For example, the first metal layer 1210 may be made of a metal such as aluminum (Al), iron (Fe), or the like, or an alloy thereof. The first metal layer 1210 may have a unilayer structure or a multilayer structure. The insulating layer 1220 may be made of a material having insulating properties, and may be formed with an inorganic material or an organic material. For example, the insulating layer 1220 may be made of an epoxy-based insulating resin, and may include metal powder such as aluminum (Al) powder, or the like, in order to enhance thermal conductivity. The second metal layer 1230 may generally be formed of a copper (Cu) thin film.

As illustrated in FIG. 4, in the metal substrate according to the present embodiment, a length of an exposed region at one end portion of the insulating layer 1220, i.e., an insulation length, may be greater than a thickness of the insulating layer 1220. In the present embodiment, the insulation length refers to a length of the exposed region of the insulating layer 1220 between the first metal layer 1210 and the second metal layer 1230. When the metal substrate 1200 is viewed from above, a width of the exposed region of the insulating layer 1220 is an exposure width W1. The region 'A' in FIG. 4 is removed through a grinding process, or the like, during the manufacturing process of the metal substrate. The region A having a depth 'h' measured downwardly from a surface of the second metal layer 1230 is removed to expose the insulating layer 1220 by the exposure width W1, thereby forming a step structure. If the end portion of the metal substrate 1200 is not removed, the insulation length (i.e., a minimum distance between the layers 1210 and 1230 along a surface of the substrate 1200) may be equal to a thickness (h1+h2) of the insulating layer 1220. However, by removing a portion A of the end portion of the metal substrate 1200, an insulation length equal to approximately W1 may be additionally secured. Thus, when a withstand voltage of the metal substrate 1200 is tested, the likelihood of contact between the two metal layers 1210 and 1230 in the end portions thereof is minimized.

Figure 5:
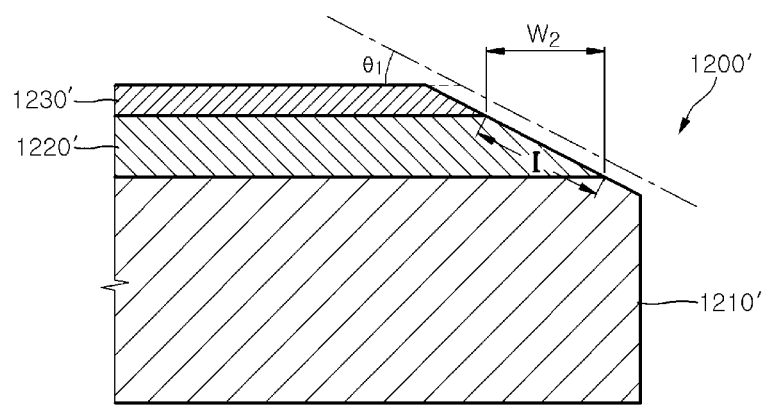
FIG. 5 is a cross-sectional view schematically illustrating a modification of the substrate of FIG. 4.

FIG. 5 is a view schematically illustrating a structure of a metal substrate according to a modification of FIG. 4. Referring to FIG. 5, a metal substrate 1200' includes a first metal layer 1210', an insulating layer 1220' formed on the first metal layer 1210', and a second metal layer 1230' formed on the insulating layer 1220'. The insulating layer 1220' and the second metal layer 1230' include regions removed at a predetermined tilt angle θ1, and the first metal layer 1210' may optionally also include a region removed at the predetermined tilt angle θ1.

Here, the tilt angle θ1 may be an angle between an interface between the insulating layer 1220' and the second metal layer 1230' and an end portion of the insulating layer 1220'. The tilt angle θ1 may be selected to secure a desired insulation length I in consideration of a thickness of the insulating layer 1220'. The tilt angle θ1 may be selected from within the range of 0<θ1<90 (degrees). As the tilt angle θ1 is increased, the insulation length I and a width W2 of the exposed region of the insulating layer 1220' is increased, so in order to secure a larger insulation length, the tilt angle θ1 may be selected to be smaller. For example, the tilt angle may be selected from within the range of 0<θ1≤45 (degrees).

Figure 6:
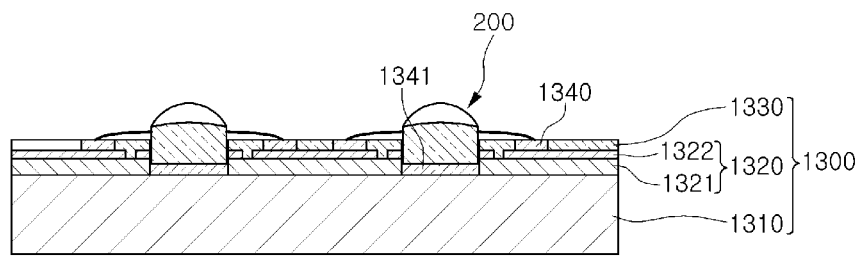
FIGS. 6, 7A, 7B, 8, and 9 are cross-sectional views schematically illustrating various examples of the substrate.

FIG. 6 schematically illustrates another example of a substrate. Referring to FIG. 6, a substrate 1300 includes a metal support substrate 1310 and resin-coated copper (RCC) 1320 formed on the metal support substrate 1310. The RCC 1320 may include an insulating layer 1321 and a copper foil 1322 laminated on the insulating layer 1321. A portion of the RCC 1320 may be removed from the surface of the metal support substrate 1310 to form at least one recess in which the light emitting device 200 may be installed. The metal substrate 1300 has a structure in which the RCC 1320 is removed from or not located in a region below the light emitting device 200 and the light emitting device 200 is in direct contact with the metal support substrate 1310. Thus, heat generated by the light emitting device 200 is directly transmitted to the metal support substrate 1310, enhancing heat dissipation performance. The light emitting device 200 may be electrically connected to be fixed through solders 1340 and 1341. A protective layer 1330 made of a liquid photo solder resist (PSR) may be formed on an upper portion of the copper foil 1322.

Figure 7A:
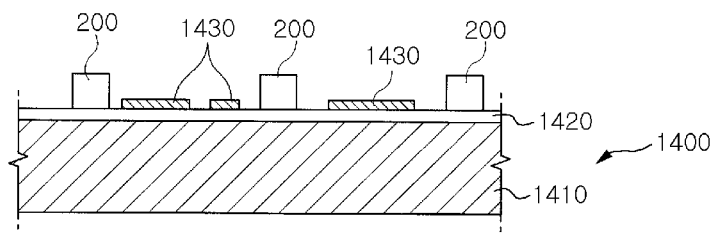
Figure 7B:
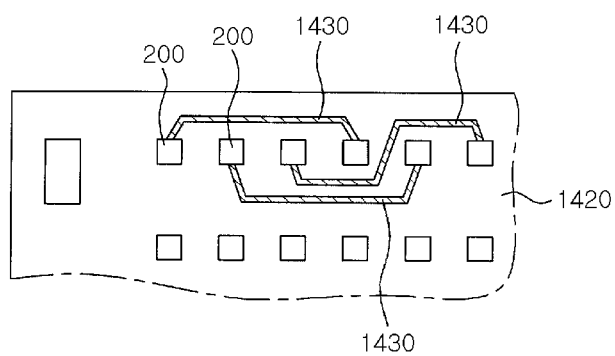

FIGS. 7A and 7B schematically illustrate another example of the substrate. A substrate according to the present embodiment includes an anodized metal substrate having excellent heat dissipation characteristics and incurring low manufacturing costs. Referring to FIGS. 7A and 7B, the anodized metal substrate 1400 may include a metal plate 1410, an anodic oxide film 1420 formed on the metal plate 1410, and electrical wirings 1430 formed on the anodic oxide film 1420. One or more light emitting devices 200 can be disposed on the anodic oxide film 1420, and interconnected by the electrical wirings 1430.

The metal plate 1410 may be made of aluminum (Al) or an Al alloy that may be easily obtained at low cost. Besides, the metal plate 1410 may be made of any other anodizable metal, for example, a material such as titanium (Ti), magnesium (Mg), or the like.

An aluminum oxide film ($Al_2O_3$) 1420 obtained by anodizing aluminum has a relatively high heat transmission characteristics ranging from about 10 W/mK to 30 W/mK. Thus, the anodized metal substrate 1400 has superior heat dissipation characteristics to those of a PCB, an MCPCB, or the like, as compared to a conventional polymer substrates.

Figure 8:
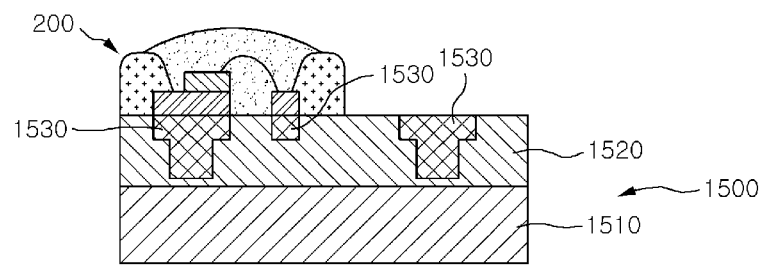

FIG. 8 schematically illustrates another example of the substrate. As illustrated in FIG. 8, a substrate 1500 may include a metal substrate 1510, an insulating resin 1520 coated on the metal substrate 1510, and a circuit pattern 1530 formed on or within the insulating resin 1520. Here, the insulating resin 1520 may have a thickness equal to or less than 200 μm. The insulating resin 1520 may be laminated on the metal substrate 1510 in the form of a solid film or may be coated in liquid form using spin coating or a blade. Also, the circuit pattern 1530 may be formed by filling a metal such as copper (Cu), or the like, in a circuit pattern intaglioed on the insulating layer 1520 or within the thickness of the insulating layer 1520. The light emitting device 200 may be mounted on the surface of the insulating layer 1520 and may be electrically connected to the circuit pattern 1530.

Figure 9:
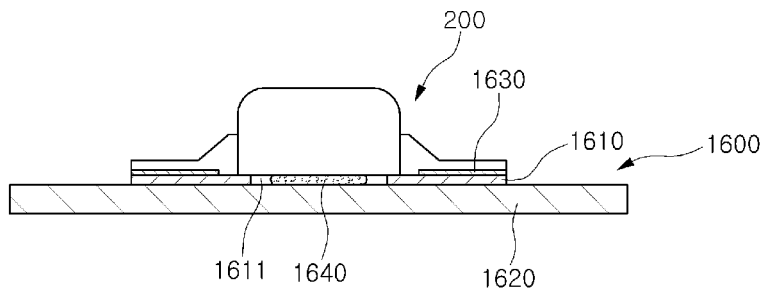

Meanwhile, the substrate may include a flexible PCB (FPCB) that can be freely deformed. As illustrated in FIG. 9, a substrate 1600 includes a flexible circuit board 1610 having one or more through holes 1611, and a support substrate 1620 on which the flexible circuit board 1610 is mounted. A heat dissipation adhesive 1640 may be provided in the through hole 1611 to couple a lower surface of the light emitting device 200 and an upper surface of the support substrate 1620. Here, the lower surface of the light emitting device 200 may be a lower surface of a chip package, a lower surface of a lead frame having an upper surface on which a chip is mounted, or a metal block. A circuit wiring 1630 is formed on the flexible circuit board 1610 and electrically connected to the light emitting device 200.

In this manner, since the flexible circuit board 1610 is used, thickness and weight can be reduced, obtaining reduced thickness and weight and reducing manufacturing costs, and since the light emitting device 200 is directly bonded to the support substrate 1620 by the heat dissipation adhesive 1640, heat dissipation efficiency in dissipating heat generated by the light emitting device 200 can be increased.

The foregoing substrate 100 may have a flat plate shape and may have a rectangular shape in which a length in a length direction is longer than that in a width direction. However, a size and a structure of the substrate 100 may be variously modified according to a structure of a device, e.g., a lighting device, in which the light source module 10 is used.

The plurality of light emitting devices 200 are mounted on the substrate 100 and electrically connected thereto. The plurality of light emitting devices 200 may be spaced apart from one another at predetermined intervals and aligned in the length direction of the substrate 100.

As the light emitting device 200, any type of photoelectric device may be used, as long as it generates light having a predetermined wavelength in response to having power applied thereto from the outside. Typically, the light emitting device 200 may include a light emitting diode (LED) in which a semiconductor layer is epitaxially grown on a growth substrate. The light emitting device 200 may emit blue light, green light, and/or red light according to a material contained therein, and may emit white light.

The light emitting device 200 may have a lamination structure including an n-type semiconductor layer, a p-type semiconductor layer, and an active layer disposed therebetween. Also, the active layer may be formed of a nitride semiconductor including $In_xAl_yGa_{1-x-y}N$ ($0 \leq x \leq 1$, $0 \leq y \leq 1$, $0 \leq x+y \leq 1$) having a single or multi-quantum well structure.

Meanwhile, as for the light emitting device 200 employable in the light source module 10 according to an embodiment of the present application as described above, LED chips having various structures or various types of LED package including such LED chips may be used. Hereinafter, various LED packages and various LED chips that may be used as light emitting devices 200 in the light source module 10 according to an embodiment of the present invention will be described.

Light Emitting Device

First Example

Figure 10:
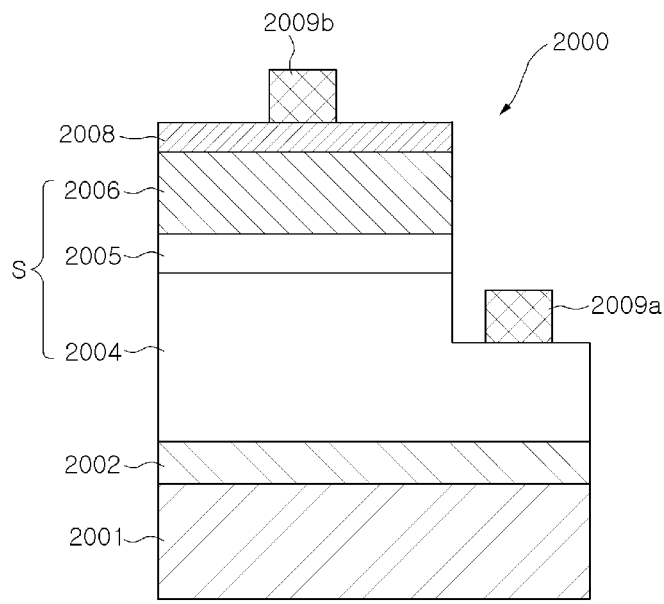
FIG. 10 is a cross-sectional view schematically illustrating an example of a light emitting device (or an LED chip) employable in the light source module of FIG. 1.

FIG. 10 is a side cross-sectional view schematically illustrating an example of a light emitting device (an LED chip).

As illustrated in FIG. 10, a light emitting device 2000 may include a light emitting laminate S formed on a growth substrate 2001. The light emitting laminate S may include a first conductivity-type semiconductor layer 2004, an active layer 2005, and a second conductivity-type semiconductor layer 2006.

An ohmic-contact layer 2008 may be formed on the second conductivity-type semiconductor layer 2006, and first and second electrodes 2009a and 2009b may be formed on upper surfaces of the first conductivity-type semiconductor layer 2004 and the ohmic-contact layer 2008, respectively.

In the present disclosure, terms such as 'upper portion', 'upper surface', 'lower portion', 'lower surface', 'lateral surface', and the like, are determined based on the orientation of the device 2000 as shown in the drawings, and in actuality, the terms may be changed according to a direction in which a light emitting device 2000 is disposed.

Hereinafter, major components of the light emitting device will be described.

[Substrate]

A substrate constituting a light emitting device is a growth substrate for epitaxial growth. As the substrate 2001, an insulating substrate, a conductive substrate, or a semiconductor substrate may be used as necessary. For example, sapphire, SiC, Si, $MgAl_2O_4$, MgO, $LiAlO_2$, $LiGaO_2$, or GaN may be used as a material of the substrate 2001. For epitaxial growth of a GaN material, a GaN substrate, a homogeneous substrate, may be desirable, but it incurs high production costs due to difficulties in the manufacturing thereof.

As a heterogeneous substrate, a sapphire substrate, a silicon carbide substrate, or the like, is largely used, and in this case, a sapphire substrate is utilized relatively more than the costly silicon carbide substrate. When a heterogeneous substrate is used, defects such as dislocation, and the like, are increased due to differences in lattice constants between a substrate material and a thin film material. Also, differences in coefficients of thermal expansion between the substrate material and the thin film material may cause bowing due to changing temperatures, and the bowing may cause cracks in the thin film. This problem may be reduced by using a buffer layer 2002 between the substrate 2001 and the light emitting laminate S based on GaN.

The substrate 2001 may be fully or partially removed or patterned during a chip manufacturing process in order to enhance optical or electrical characteristics of the LED chip before or after the light emitting laminate S is grown.

For example, a sapphire substrate may be separated by irradiating a laser on the interface between the substrate and a semiconductor layer through the substrate, and a silicon substrate or a silicon carbide substrate may be removed through a method such as polishing, etching, or the like.

In removing the substrate, a support substrate may be used, and in this case, in order to enhance luminance efficiency of an LED chip on the opposite side of the original growth substrate, the support substrate may be bonded by using a reflective metal or a reflective structure may be inserted into the center of a junction layer.

Substrate patterning can be used to form a concavo-convex surface or a sloped surface on a main surface (one surface or both surfaces) or lateral surfaces of a substrate before or after the growth of the light emitting laminate S, enhancing light extraction efficiency. A pattern size may be selected having feature sizes within the range from 5 nm to 500 μm. The substrate may have any structure as long as it has a regular or irregular pattern to enhance light extraction efficiency. The substrate may have various shapes such as a columnar shape, a peaked shape, a hemispherical shape, a polygonal shape, and the like.

In one example, a sapphire substrate is used, the substrate having a crystal having Hexa-Rhombo R3c symmetry, of which lattice constants in c-axial and a-axial directions are approximately 13.001 Å and 4.758 Å, respectively, and has a C-plane (0001), an A-plane (1120), an R-plane (1102), and the like. In this case, the C-plane of sapphire crystal allows a nitride thin film to be relatively easily grown thereon and is stable at high temperatures, so the sapphire substrate is commonly used as a nitride growth substrate.

The substrate 2001 may also be made of silicon (Si). Since a silicon (Si) substrate is more appropriate for increasing a diameter and is relatively low in price, it may be used to facilitate mass-production. Here, a difference in lattice constants between the silicon substrate having (111) plane as a substrate surface and GaN can be approximately 17%, and application of a technique of suppressing the generation of crystal defects due to the difference between the lattice constants can advantageously be used. Also, a difference in coefficients of thermal expansion between silicon and GaN is approximately 56%, and a technique of suppressing bowing of a wafer generated due to the difference in the coefficients of thermal expansion can advantageously be used. Bowed wafers may result in cracks in the GaN thin film and make it difficult to control processes to increase dispersion of emission wavelengths (or excitation wavelengths) of light in the same wafer, or the like.

The silicon substrate can absorb light generated in the GaN-based semiconductor, lowering external quantum yield of the light emitting device. Thus, the substrate may be removed and a support substrate such as a silicon substrate, a germanium substrate, a SiAl substrate, a ceramic substrate, a metal substrate, or the like, including a reflective layer may be additionally formed to be used, as necessary.

[Buffer Layer]

When a GaN thin film is grown on a heterogeneous substrate such as the silicon substrate, dislocation density may be increased due to a lattice constant mismatch between a substrate material and a thin film material, and cracks and warpage (or bowing) may be generated due to a difference between coefficients of thermal expansion. In order to prevent dislocation of and cracks in the light emitting laminate S, the buffer layer 2002 may be disposed between the substrate 1001 and the light emitting laminate S. The buffer layer 1002 may serve to adjust a degree of warpage of the substrate when an active layer is grown, to reduce a wavelength dispersion of a wafer.

The buffer layer 2002 may be made of $Al_xIn_yGa_{1-x-y}N$ ($0 \leq x \leq 1$, $0 \leq y \leq 1$, $0 \leq x+y \leq 1$), in particular, GaN, AlN, AlGaN, InGaN, or InGaNAlN, and a material such as $ZrB_2$, $HfB_2$, ZrN, HfN, TiN, or the like, may also be used as necessary. Also, the buffer layer may be formed by combining a plurality of layers or by gradually changing a composition.

A silicon (Si) substrate has a coefficient of thermal expansion significantly different from that of GaN. Thus, in the case of growing a GaN-based thin film on the silicon substrate, when a GaN thin film is grown at a high temperature and is subsequently cooled to room temperature, tensile stress is applied to the GaN thin film due to the difference in the coefficients of thermal expansion between the silicon substrate and the GaN thin film, generating cracks. In this case, in order to prevent the generation of cracks, a method of growing the GaN thin film such that compressive stress is applied to the GaN thin film while the GaN thin film is being grown is used to compensate for tensile stress.

A difference in the lattice constants between silicon (Si) and GaN involves a high possibility of a defect being generated therein. In the case of a silicon substrate, a buffer layer having a composite structure may be used in order to control stress for restraining warpage (or bowing) as well as controlling a defect.

For example, first, an AlN layer is formed on the substrate 2001. In this case, a material not including gallium (Ga) may be used in order to prevent a reaction between silicon (Si) and gallium (Ga). Besides AlN, a material such as SiC, or the like, may also be used. The AlN layer is grown at a temperature ranging from 400° C. to 1,300° C. by using an aluminum (Al) source and a nitrogen (N) source. An AlGaN intermediate layer may be inserted into the center of GaN between the plurality of AlN layers to control stress, as necessary.

[Light Emitting Laminate]

The light emitting laminate S having a multilayer structure of a Group III nitride semiconductor will be described in detail. The first and second conductivity-type semiconductor layers 2004 and 2006 may be formed of n-type and p-type impurity-doped semiconductor materials, respectively.

However, the present invention is not limited thereto and, conversely, the first and second conductivity-type semiconductor layers 2004 and 2006 may be formed of p-type and n-type impurity-doped semiconductor materials, respectively. For example, the first and second conductivity-type semiconductor layers 2004 and 2006 may be made of a Group III nitride semiconductor, e.g., a material having a composition of $Al_xIn_yGa_{1-x-y}N$ ($0 \leq x \leq 1$, $0 \leq y \leq 1$, $0 \leq x+y \leq 1$). Of course, the present invention is not limited thereto and the first and second conductivity-type semiconductor layers 2004 and 2006 may also be made of a material such as an AlGaInP-based semiconductor or an AlGaAs-based semiconductor.

Meanwhile, the first and second conductivity-type semiconductor layers 2004 and 2006 may have a unilayer structure, or, alternatively, the first and second conductivity-type semiconductor layers 2004 and 2006 may have a multilayer structure including layers having different compositions, thicknesses, and the like, as necessary. For example, the first and second conductivity-type semiconductor layers 2004 and 2006 may have a carrier injection layer for improving electron and hole injection efficiency, or may have various types of superlattice structure, respectively.

The first conductivity-type semiconductor layer 2004 may further include a current spreading layer (not shown) in a region adjacent to the active layer 2005. The current spreading layer may have a structure in which a plurality of $In_xAl_yGa_{(1-x-y)}N$ layers having different compositions or different impurity contents are iteratively laminated or may have an insulating material layer partially formed therein.

The second conductivity-type semiconductor layer 2006 may further include an electron blocking layer in a region adjacent to the active layer 2005. The electron blocking layer may have a structure in which a plurality of $In_xAl_yGa_{(1-x-y)}N$ layers having different compositions are laminated or may have one or more layers including $Al_yGa_{(1-y)}N$. The electron blocking layer has a bandgap wider than that of the active layer 2005, thus preventing electrons from being transferred via the second conductivity-type (p-type) semiconductor layer 2006.

The light emitting laminate S may be formed by using metal-organic chemical vapor deposition (MOCVD). In order to fabricate the light emitting laminate S, an organic metal compound gas (e.g., trimethyl gallium (TMG), trimethyl aluminum (TMA)) and a nitrogen-containing gas (ammonia ($NH_3$), or the like) are supplied to a reaction container in which the substrate 2001 is installed as reactive gases, the substrate being maintained at a high temperature ranging from 900° C. to 1,100° C., and while a gallium nitride-based compound semiconductor is being grown, an impurity gas is supplied as necessary to laminate the gallium nitride-based compound semiconductor as an undoped n-type or p-type semiconductor. Silicon (Si) is a well known n-type impurity and p-type impurity includes zinc (Zn), cadmium (Cd), beryllium (Be), magnesium (Mg), calcium (Ca), barium (Ba), and the like. Among these, magnesium (Mg) and zinc (Zn) may be mainly used.

Also, the active layer 2005 disposed between the first and second conductivity-type semiconductor layers 2004 and 2006 may have a multi-quantum well (MQW) structure in which a quantum well layer and a quantum barrier layer are alternately laminated. For example, in the case of a nitride semiconductor, a GaN/InGaN structure may be used, or a single quantum well (SQW) structure may also be used.

[Ohmic-Contact Layer and First and Second Electrodes]

The ohmic-contact layer 2008 may have a relatively high impurity concentration to have low ohmic-contact resistance to lower an operating voltage of the element and enhance element characteristics. The ohmic-contact layer 2008 may be formed of a GaN layer, a InGaN layer, a ZnO layer, or a graphene layer.

The first or second electrode 2009a or 2009b may be made of a material such as silver (Ag), nickel (Ni), aluminum (Al), rhodium (Rh), palladium (Pd), iridium (Ir), ruthenium (Ru), magnesium (Mg), zinc (Zn), platinum (Pt), gold (Au), or the like, and may have a structure including two or more layers such as Ni/Ag, Zn/Ag, Ni/Al, Zn/Al, Pd/Ag, Pd/Al, Ir/Ag, Ir/Au, Pt/Ag, Pt/Al, Ni/Ag/Pt, or the like.

The LED chip illustrated in FIG. 10 has a structure in which first and second electrodes face the same surface as a light extraction surface, but it may also be implemented to have various other structures, such as a flipchip structure in which first and second electrodes face a surface opposite to a light extraction surface, a vertical structure in which first and second electrodes are formed on mutually opposing surfaces, a vertical and horizontal structure employing an electrode structure by forming several vias in a chip as a structure for enhancing current spreading efficiency and heat dissipation efficiency, and the like.

Light Emitting Device

Second Example

Figure 11:
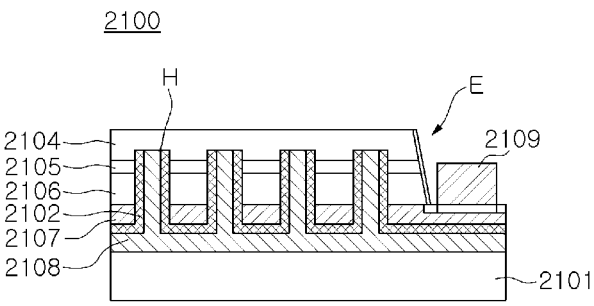
FIG. 11 is a cross-sectional view schematically illustrating another example of a light emitting device (or an LED chip) employable in the light source module of FIG. 1.

In case of manufacturing a large light emitting device for a high output, an LED chip illustrated in FIG. 11 having a structure promoting current spreading efficiency and heat dissipation efficiency may be provided.

As illustrated in FIG. 11, the LED chip 2100 may include a first conductivity-type semiconductor layer 2104, an active layer 2105, a second conductivity-type semiconductor layer 2106, a second electrode layer 2107, an insulating layer 2102, a first electrode 2108, and a substrate 2101, laminated sequentially. Here, in order to be electrically connected to the first conductivity-type semiconductor layer 2104, the first electrode layer 2108 includes one or more contact holes H extending from one surface of the first electrode layer 2108 to at least a partial region of the first conductivity-type semiconductor layer 2104 and electrically insulated from the second conductivity-type semiconductor layer 2106 and the active layer 2105. However, the first electrode layer 2108 is not an essential element in the present embodiment.

The contact hole H extends from an interface of the first electrode layer 2108, passing through the second electrode layer 2107, the second conductivity-type semiconductor layer 2106, and the first active layer 2105, to the interior of the first conductivity-type semiconductor layer 2104. The contact hole H extends at least to an interface between the active layer 2105 and the first conductivity-type semiconductor layer 2104, and preferably, extends to a portion of the first conductivity-type semiconductor layer 2104. However, the contact hole H is formed for electrical connectivity and current spreading, so the purpose of the presence of the contact hole H is achieved when it is in contact with the first conductivity-type semiconductor layer 2104. Thus, it is not necessary for the contact hole H to extend to an external surface of the first conductivity-type semiconductor layer 2104.

The second electrode layer 2107 formed on the second conductivity-type semiconductor layer 2106 may be selectively made of a material among silver (Ag), nickel (Ni), aluminum (Al), rhodium (Rh), palladium (Pd), iridium (Ir), ruthenium (Ru), magnesium (Mg), zinc (Zn), platinum (Pt), gold (Au), and the like, in consideration of a light reflecting function and an ohmic-contact function with the second conductivity-type semiconductor layer 2106, and may be formed by using a process such as sputtering, deposition, or the like.

The contact hole H may have a form penetrating the second electrode layer 2107, the second conductivity-type semiconductor layer 2106, and the active layer 2105 so as to be connected to the first conductivity-type semiconductor layer 2104. The contact hole H may be formed through an etching process, e.g., inductively coupled plasma-reactive ion etching (ICP-RIE), or the like.

The insulating layer 2102 is formed to cover a side wall of the contact hole H and a lower surface of the second electrode layer 2107. In this case, at least a portion of the first conductivity-type semiconductor layer 2104 may be exposed by the contact hole H. The insulating layer 2102 may be formed by depositing an insulating material such as $SiO_2$, $SiO_xN_y$, or $Si_xN_y$. The insulating layer 2102 may be deposited to have a thickness ranging from about 0.01 µm to 3 µm at a temperature equal to or lower than 500° C. through a chemical vapor deposition (CVD) process.

The first electrode layer 2108 including a conductive via formed by filling a conductive material is formed within the contact hole H. A plurality of conductive vias may be formed in a single light emitting device region. The amount of vias and contact areas thereof may be adjusted such that the area of the plurality of vias occupying on the plane of the regions in which they are in contact with the first conductivity-type semiconductor layer 2104 ranges from 1% to 5% of the area of the light emitting device region. A radius of the via on the plane of the region in which the vias are in contact with the first conductivity-type semiconductor layer 2104 may range, for example, from 5 µm to 50 µm, and the number of vias may be 1 to 50 per light emitting device region according to a width of the light emitting device region. Although different according to a width of the light emitting device region, three or more vias may be provided. A distance between the vias may range from 100 µm to 500 µm, and the vias may have a matrix structure including rows and columns. Preferably, the distance between the vias may range from 150 µm to 450 µm. If the distance between the vias is smaller than 100 µm, the amount of vias is increased to relatively reduce a light emitting area to lower luminous efficiency, and if the distance between the vias is greater than 500 µm, current spreading may suffer to degrade luminous efficiency. A depth of the contact hole H may range from 0.5 µm to 5.0 µm, although the depth of the contact hole H V may vary according to a thickness of the second conductivity-type semiconductor layer and the active layer.

Subsequently, the substrate 2101 is formed on the first electrode layer 2108. In this structure, the substrate 2101 may be electrically connected by the conductive via connected to the first conductivity-type semiconductor layer 2104.

The substrate 2101 may be made of a material including any one of Au, Ni, Al, Cu, W, Si, Se, GaAs, SiAl, Ge, SiC, AlN, $Al_2O_3$, GaN, AlGaN and may be formed through a process such as plating, sputtering, deposition, bonding, or the like.

In order to reduce contact resistance, the amount, a shape, a pitch, a contact area with the first and second conductivity-type semiconductor layers 2104 and 2106, and the like, of the contact hole H may be appropriately regulated. The contact holes H may be arranged to have various shapes in rows and columns to improve a current flow. Here, the second electrode layer 2107 may have one or more exposed regions in the interface between the second electrode layer 2017 and the second conductivity-type semiconductor layer 2106, i.e., an exposed region E. An electrode pad part 2109 connecting an external power source to the second electrode layer 2107 may be provided on the exposed region E.

In this manner, the LED chip 2100 illustrated in FIG. 11 may include the light emitting structure having the first and second main surfaces opposing one another and having the first and second conductivity-type semiconductor layers 2104 and 2106 providing the first and second main surfaces, respectively, and the active layer 2105 formed therebetween, the contact holes H connected to a region of the first conductivity-type semiconductor layer 2104 through the active layer 2105 from the second main surface, the first electrode layer 2108 formed on the second main surface of the light emitting structure and connected to a region of the first conductivity-type semiconductor layer 2104 through the contact holes H, and the second electrode layer 2107 formed on the second main surface of the light emitting structure and connected to the second conductivity-type semiconductor layer 2106. Here, any one of the first and second electrodes 2108 and 2107 may be drawn out in a lateral direction of the light emitting structure.

Light Emitting Device

Third Example

A lighting device using an LED provides improved heat dissipation characteristics, but in the aspect of overall heat dissipation performance, preferably, the lighting device employs an LED chip having a low heating value. As an LED chip satisfying such requirements, an LED chip including a nano-structure (hereinafter, referred to as a 'nano-LED chip') may be used.

Such a nano-LED chip includes a recently developed core/shell type nano-LED chip, which has a low binding density to generate a relatively low degree of heat, has increased luminous efficiency by increasing a light emitting region by utilizing nano-structures, and prevents a degradation of efficiency due to polarization by obtaining a non-polar active layer, thus improving drop characteristics.

Figure 12:
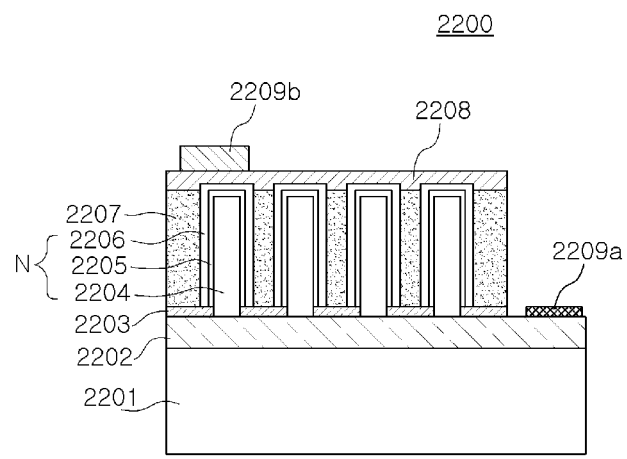
FIG. 12 is a cross-sectional view schematically illustrating another example of a light emitting device (or an LED chip) employable in the light source module of FIG. 1.

FIG. 12 is a cross-sectional view illustrating a nano-LED chip as another example of an LED chip that may be employed in a light source module.

As illustrated in FIG. 12, a nano-LED chip 2200 includes a plurality of nano-light emitting structures N formed on a substrate 2201. In this example, it is illustrated that the nano-light emitting structures N have a core-shell structure as a rod structure, but the present invention is not limited thereto and the nano-light emitting structures N may have a different structure such as a pyramid structure.

The nano-LED chip 2200 includes a base layer 2202 formed on the substrate 2201. The base layer 2202 is a layer providing a growth surface for the nano-light emitting structure, which may be a first conductivity-type semiconductor layer. A mask layer 2203 having an open area for the growth of the nano-light emitting structures N (in particular, the core) may be formed on the base layer 2202. The mask layer 2203 may be made of a dielectric material such as $SiO_2$ or SiNx.

In the nano-light emitting structures N, a first conductivity-type nano-core 2204 is formed by selectively growing a first conductivity-type semiconductor by using the mask layer 2203 having an open area, and an active layer 2205 and a second conductivity-type semiconductor layer 2206 are formed as shell layers on a surface of the nano core 2204. Accordingly, the nano-light emitting structures N may have a core-shell structure in which the first conductivity-type semiconductor is the nano core and the active layer 2205 and the second conductivity-type semiconductor layer 2206 enclosing the nano core are shell layers.

The nano-LED chip 2200 according to the present example includes a filler material 2207 filling spaces between the nano-light emitting structures N. The filler material 2207 may structurally stabilize the nano-light emitting structures N and may be employed as necessary in order to optically improve the nano-light emitting structures N. The filler material 2207 may be made of a transparent material such as $SiO_2$, or the like, but the present invention is not limited thereto. An ohmic-contact layer 2208 may be formed on the nano-light emitting structures and connected to the second conductivity-type semiconductor layer 2206. The nano-LED chip 2200 includes first and second electrodes 2209a and 2209b connected to the base layer 2202 formed of the first conductivity-type semiconductor and the ohmic-contact layer 2208, respectively.

By forming the nano-light emitting structures such that they have different diameters, components, and doping densities, light having two or more different wavelengths may be emitted from the single device. By appropriately adjusting light having different wavelengths, white light may be implemented without using phosphors in the single device, and light having various desired colors or white light having different color temperatures may be implemented by combining a different LED chip with the foregoing device or combining wavelength conversion materials such as phosphors.

Light Emitting Device

Fourth Example

Figure 13:
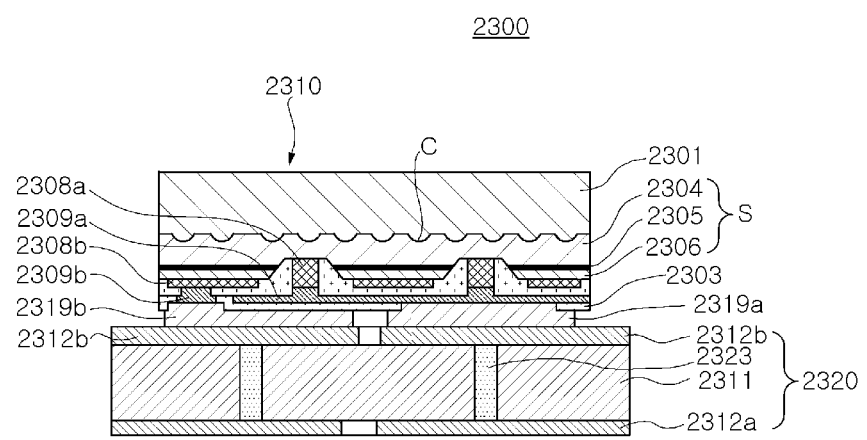
FIG. 13 is a cross-sectional view illustrating an example of an LED chip as a light emitting device employable in the light source module of FIG. 1, mounted on a mounting board.

FIG. 13 illustrates a semiconductor light emitting device 2300 having an LED chip 2310 mounted on a mounting substrate 2320 as a light source that may be employed in the foregoing lighting device.

The semiconductor light emitting device 2300 illustrated in FIG. 13 includes an LED chip 2310 mounted on a mounting substrate 2320. The LED chip 2310 is presented as an LED chip different from that of the example described above.

The LED chip 2310 includes a light emitting laminate S disposed in one surface of the substrate 2301 and first and second electrodes 2308a and 2308b disposed on the opposite side of the substrate 2301 based on the light emitting laminate S. Also, the LED chip 2310 includes an insulating part 2303 covering the first and second electrodes 2308a and 2308b.

The first and second electrodes 2308a and 2308b may include first and second electrode pads 2319a and 2319b connected thereto by electrical connection parts 2309a and 2309b.

The light emitting laminate S may include a first conductivity-type semiconductor layer 2304, an active layer 2305, and a second conductivity-type semiconductor layer 2306. The first electrode 2308a may be provided as a conductive via connected to the first conductivity-type semiconductor layer 2304 through the second conductivity-type semiconductor layer 2306 and the active layer 2305. The second electrode 2308b may be connected to the second conductivity-type semiconductor layer 2306.

A plurality of conductive vias may be formed in a single light emitting device region. The amount of vias and contact areas thereof may be adjusted such that the area the plurality of vias occupy on the plane of the regions in which they are in contact with the first conductivity-type semiconductor layer 2104 ranges from 1% to 5% of the area of the light emitting device region. A radius of the via on the plane of the regions in which the vias are in contact with the first conductivity-type semiconductor layer 2304 may range, for example, from 5 μm to 50 μm, and the number of vias may be 1 to 50 per light emitting device region according to a width of the light emitting device region. Although different according to a width of the light emitting device region, three or more vias may be provided. A distance between the vias may range from 100 μm to 500 μm, and the vias may have a matrix structure including rows and columns. Preferably, the distance between the vias may range from 150 μm to 450 μm. If the distance between the vias is smaller than 100 μm, the amount of vias is increased to relatively reduce a light emitting area to lower luminous efficiency, and if the distance between the vias is greater than 500 μm, current spreading may suffer to degrade luminous efficiency. A depth of the vias may range from 0.5 μm to 5.0 μm, although the depth of the vias may vary according to a thickness of the second conductivity-type semiconductor layer and the active layer.

The first and second electrodes 2308a and 2308b are formed by depositing a conductive ohmic material on the light emitting laminate S. The first and second electrodes 2308a and 2308b may include at least one of silver (Ag), aluminum (Al), nickel (Ni), chromium (Cr), copper (Cu), gold (Au), palladium (Pd), platinum (Pt), tin (Sn), titanium (Ti), tungsten (W), rhodium (Rh), iridium (Ir), ruthenium (Ru), magnesium (Mg), zinc (Zn), and an alloy material thereof. For example, the second electrode 2308b may be an ohmic electrode of a silver (Ag) layer laminated on the basis of the second conductivity-type semiconductor layer 2306. The Ag ohmic electrode may serve as a reflective layer of light. A single layer of nickel (Ni), titanium (Ti), platinum (Pt), tungsten (W), or an alloy layer thereof may be alternatively laminated on the Ag layer. In detail, an Ni/Ti layer, a TiW/Pt layer, or a Ti/W layer may be laminated on an Ag layer, or these layers may be alternately laminated on the Ag layer.

As the first electrode 2308a, on the basis of the first conductivity-type semiconductor layer 2304, a Cr layer may be laminated and Au/Pt/Ti layers may be sequentially laminated on the Cr layer, or on the basis of the second conductivity-type semiconductor layer 2306, an Al layer is laminated and Ti/Ni/Au layers may be sequentially laminated on the Al layer. The first and second electrodes 2308a and 2308b may be made of various other materials or may have various other lamination structures in order to enhance ohmic characteristics or reflecting characteristics.

The insulating part 2303 may have an open area exposing at least portions of the first and second electrodes 2308a and 2308b, and the first and second electrode pads 2319a and 2319b may be connected to the first and second electrodes 2308a and 2308b. The insulating part 2303 may be deposited to have a thickness ranging from 0.01 μm to 3 μm at a temperature equal to or lower than 500° C. through an $SiO_2$ and/or SiN CVD process.

The first and second electrodes 2308a and 2308b may be disposed in the same direction and may be mounted as a so-called flip-chip on a lead frame, or the like, as described hereinafter.

In particular, the first electrode 2308a may be connected to the first electrical connection part 2309a having a conductive via connected to the first conductivity-type semiconductor layer 2304 by passing through the second conductivity-type semiconductor layer 2306 and the active layer 2305 within the light emitting laminate S.

The amount, a shape, a pitch, a contact area with the first conductivity-type semiconductor layer 2304, and the like, of the conductive via and the first electrical connection part 2309a may be appropriately regulated in order to lower contact resistance, and the conductive via and the first electrical connection part 2309a may be arranged in a row and in a column to improve current flow.

Another electrode structure may include the second electrode 2308b directly formed on the second conductivity-type semiconductor layer 2306 and the second electrical connection portion 2309b formed on the second electrode 2308b. In addition to having a function of forming electrical-ohmic connection with the second conductivity-type semiconductor layer 2306, the second electrode 2308b may be made of a light reflective material, whereby, as illustrated in FIG. 13, in a state in which the LED chip 2310 is mounted as a so-called flip chip structure, light emitted from the active layer 2305 can be effectively emitted in a direction of the substrate 2301. Of course, the second electrode 2308b may be made of a light-transmissive conductive material such as a transparent conductive oxide, according to a main light emitting direction.

The two electrode structures as described above may be electrically separated by the insulating part 2303. The insulating part 2303 may be made of any material as long as it has electrically insulating properties. Namely, the insulating part 2303 may be made of any material having electrically insulating properties, and here, preferably, a material having a low degree of light absorption is used. For example, a silicon oxide or a silicon nitride such as $SiO_2$, $SiO_xN_y$, $Si_xN_y$, or the like, may be used. If necessary, a light reflective filler may be dispersed within the light-transmissive material to form a light reflective structure.

The first and second electrode pads 2319a and 2319b may be connected to the first and second electrical connection parts 2309a and 2309b to serve as external terminals of the LED chip 2310, respectively. For example, the first and second electrode pads 2319a and 2319b may be made of gold (Au), silver (Ag), aluminum (Al), titanium (Ti), tungsten (W), copper (Cu), tin (Sn), nickel (Ni), platinum (Pt), chromium (Cr), NiSn, TiW, AuSn, or a eutectic metal thereof. In this case, when the LED chip is mounted on the mounting substrate 1320, the first and second electrode pads 2319a and 2319b may be bonded by using the eutectic metal, so solder bumps generally required for flip chip bonding may not be used. The use of a eutectic metal advantageously obtains superior heat dissipation effects in the mounting method in comparison to the case of using solder bumps. In this case, in order to obtain excellent heat dissipation effects, the first and second electrode pads 2319a and 2319b may be formed to occupy a relatively large area.

The substrate 2301 and the light emitting laminate S may be understood with reference to content described above with reference to FIG. 10, unless otherwise described. Also, although not shown, a buffer layer may be formed between the light emitting structure S and the substrate 2301. The buffer layer may be employed as an undoped semiconductor layer made of a nitride, or the like, to alleviate lattice defects of the light emitting structure grown thereon.

The substrate 2301 may have first and second main surfaces opposing one another, and an uneven structure (i.e., a depression and protrusion pattern) may be formed on at least one of the first and second main surfaces. The uneven structure formed on one surface of the substrate 2301 may be formed by etching a portion of the substrate 2301 so as to be made of the same material as that of the substrate 2301. Alternatively, the uneven structure may be made of a heterogeneous material different from that of the substrate 2301.

In the present embodiment, since the uneven structure is formed on the interface between the substrate 2301 and the first conductivity-type semiconductor layer 2304, paths of light emitted from the active layer 1305 can be of diversity, and thus, a light absorption ratio of light absorbed within the semiconductor layer can be reduced and a light scattering ratio can be increased, increasing light extraction efficiency.

In detail, the uneven structure may be formed to have a regular or irregular shape. The heterogeneous material used to form the uneven structure may be a transparent conductor, a transparent insulator, or a material having excellent reflectivity. Here, as the transparent insulator, a material such as SiO2, SiNx, $Al_2O_3$, HfO, $TiO_2$, or ZrO may be used. As the transparent conductor, a transparent conductive oxide (TCO) such as ZnO, an indium oxide containing an additive (e.g., Mg, Ag, Zn, Sc, Hf, Zr, Te, Se, Ta, W, Nb, Cu, Si, Ni, Co, Mo, Cr, Sn), or the like, may be used. As the reflective material, silver (Ag), aluminum (Al), or a distributed Bragg reflector (DBR) including multiple layers having different refractive indices, may be used. However, the present invention is not limited thereto.

The substrate 2301 may be removed from the first conductivity-type semiconductor layer 2304. To remove the substrate 2301, a laser lift-off (LLO) process using a laser, an etching or a polishing process may be used. Also, after the substrate 2301 is removed, depressions and protrusions may be formed on the surface of the first conductivity-type semiconductor layer 1304.

As illustrated in FIG. 13, the LED chip 2310 is mounted on the mounting substrate 2320. The mounting substrate 2320 includes upper and lower electrode layers 2312b and 2312a formed on upper and lower surfaces of the substrate body 2311, and vias 2313 penetrating through the substrate body 2311 to connect the upper and lower electrode layers 2312b and 2312a. The substrate body 2311 may be made of a resin, a ceramic, or a metal, and the upper or lower electrode layer 2312b or 2312a may be a metal layer made of gold (Au), copper (Cu), silver (Ag), or aluminum (Al).

Of course, the substrate on which the foregoing LED chip 2310 is mounted is not limited to the configuration of the mounting substrate 2320 illustrated in FIG. 13, and any substrate having a wiring structure for driving the LED chip 2310 may be employed. For example, any one of the substrates described above with reference to FIGS. 3 through 9 may be employed, or a package structure in which an LED chip is mounted on a package body having a pair of lead frames may be provided.

<Other examples of Light emitting devices>

LED chips having various structures other than that of the foregoing LED chip described above may also be used. For example, an LED chip in which surface-plasmon polaritons (SPP) are formed in a metal-dielectric boundary of an LED chip to interact with quantum well excitons, thus obtaining significantly improved light extraction efficiency, may also be advantageously used.

Meanwhile, the light emitting device 200 may be configured to include at least one of a light emitting device emitting white light by combining yellow, green, red, and orange phosphors with a blue LED chip and a purple, blue, green, red, and infrared light emitting device. In this case, the light emitting device 200 may control a color rendering index (CRI) to range from a sodium-vapor (Na) lamp (40) to a sunlight level (100), or the like, and control a color temperature ranging from 2000K to 20000K level to generate various levels of white light. If necessary, the light emitting device 200 may generate visible light having purple, blue, green, red, orange colors, or infrared light to adjust an illumination color according to a surrounding atmosphere or mood. Also, the light emitting device may generate light having a special wavelength stimulating plant growth.

Figure 14:
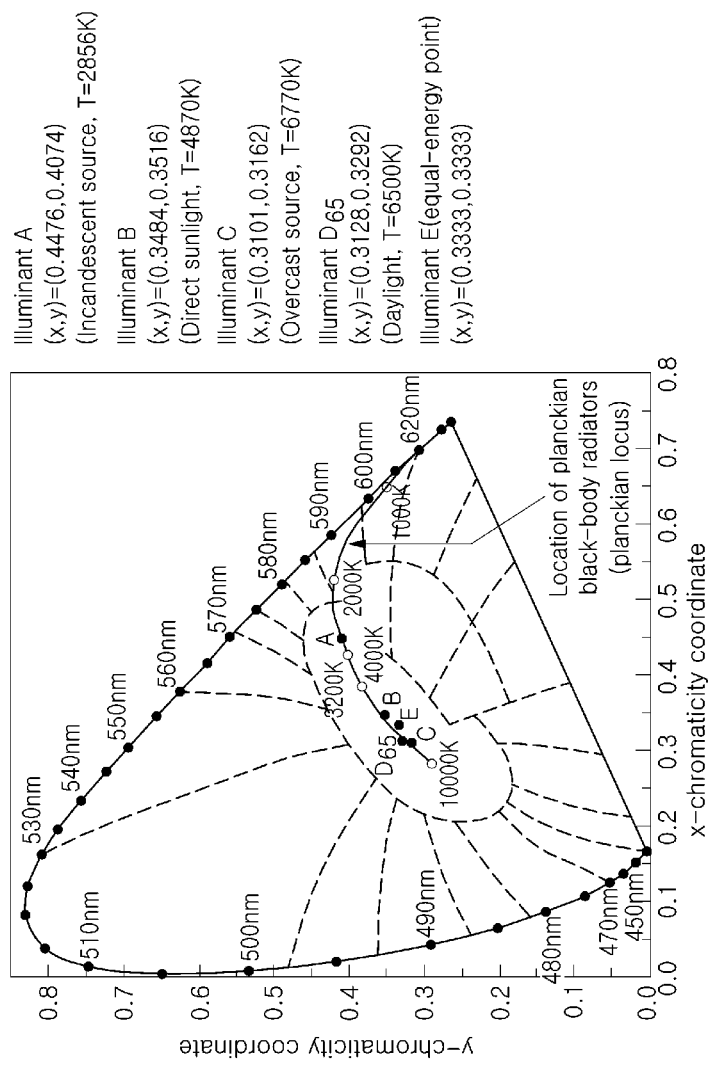
FIG. 14 is a view illustrating the CIE 1931 color space chromaticity diagram.

White light generated by combining yellow, green, red phosphors to a blue LED and/or combining at least one of a green LED and a red LED thereto may have two or more peak wavelengths and may be positioned in a segment linking (x, y) coordinates (0.4476, 0.4074), (0.3484, 0.3516), (0.3101, 0.3162), (0.3128, 0.3292), (0.3333, 0.3333) of a CIE 1931 chromaticity diagram illustrated in FIG. 14. Alternatively, white light may be positioned in a region surrounded by a spectrum of black body radiation and the segment. A color temperature of white light corresponds to a range from about 2000K to about 20000K.

Phosphors may have the following empirical formula and colors.

Oxide-based phosphors: Yellow and green $Y_3Al_5O_{12}$:Ce, $Tb_3Al_5O_{12}$:Ce, $Lu_3Al_5O_{12}$:Ce Silicate-based phosphors: Yellow and green $(Ba,Sr)_2SiO_4$:Eu, yellow and orange $(Ba,Sr)_3SiO_5$:Ce Nitride-based phosphors: Green β-SiAlON:Eu, yellow $L_3Si_6O_{11}$:Ce, orange α-SiAlON:Eu, red $CaAlSiN_3$:Eu, $Sr_2Si_5N_8$:Eu, $SrSiAl_4N_7$:Eu Fluoride-based phosphors: KSF-based red $K_2SiF_6$:Mn4+

Phosphor compositions should be basically conformed with Stoichiometry, and respective elements may be substituted with different elements of respective groups of the periodic table. For example, strontium (Sr) may be substituted with barium (Ba), calcium (Ca), magnesium (Mg), or the like, of alkali earths, and yttrium (Y) may be substituted with terbium (Tb), Lutetium (Lu), scandium (Sc), gadolinium (Gd), or the like. Also, europium (Eu), an activator, may be substituted with cerium (Ce), terbium (Tb), praseodymium (Pr), erbium (Er), ytterbium (Yb), or the like, according to a desired energy level, and an activator may be applied alone, or a coactivator, or the like, may be additionally applied to change characteristics.

Also, materials such as quantum dots, or the like, may be applied as materials that replace phosphors, and phosphors and quantum dots may be used in combination or alone in an LED.

A quantum dot may have a structure including a core (3 nm to 10 nm) such as CdSe, InP, or the like, a shell (0.5 nm to 2 nm) such as ZnS, ZnSe, or the like, and a ligand for stabilizing the core and the shell, and may implement various colors according to sizes.

Table 1 below shows types of phosphors in applications fields of white light emitting devices using a blue LED (wavelength: 440 nm to 460 nm).

TABLE 1

| Purpose | Phosphors |
| --- | --- |
| LED TV BLU | β-SiAlON:Eu2+ |
| | (Ca,Sr)AlSiN3:Eu2+ |
| | L3Si6O11:Ce3+ |
| | K2SiF6:Mn4+ |
| Lighting Devices | Lu3Al5O12:Ce3+ |
| | Ca-α-SiAlON:Eu2+ |
| | L3Si6N11:Ce3+ |
| | (Ca,Sr)AlSiN3:Eu2+ |
| | Y3Al5O12:Ce3+ |
| | K2SiF6:Mn4+ |
| Side Viewing | Lu3Al5O12:Ce3+ |
| (Mobile, Notebook PC) | Ca-α-SiAlON:Eu2+ |
| | L3Si6N11:Ce3+ |
| | (Ca,Sr)AlSiN3:Eu2+ |
| | Y3Al5O12:Ce3+ |
| | (Sr,Ba,Ca,Mg)2SiO4:Eu2+ |
| | K2SiF6:Mn4+ |
| Electrical Components | Lu3Al5O12:Ce3+ |
| (Vehicle Head Lamp, etc.) | Ca-α-SiAlON:Eu2+ |
| | L3Si6N11:Ce3+ |
| | (Ca,Sr)AlSiN3:Eu2+ |
| | Y3Al5O12:Ce3+ |
| | K2SiF6:Mn4+ |

Phosphors or quantum dots may be applied by using at least one of a method of spraying them on a light emitting device, a method of covering as a film, and a method of attaching as a sheet of ceramic phosphor, or the like.

As the spraying method, dispensing, spray coating, or the like, is generally used, and dispensing includes a pneumatic method and a mechanical method such as a screw fastening scheme, a linear type fastening scheme, or the like. Through a jetting method, an amount of dotting may be controlled through a very small amount of discharging and color coordinates (or chromaticity) may be controlled therethrough. In the case of a method of collectively applying phosphors on a wafer level or on a mounting board on which an LED is mounted, productivity can be enhanced and a thickness can be easily controlled.

The method of directly covering a light emitting device with phosphors or quantum dots as a film may include electrophoresis, screen printing, or a phosphor molding method, and these methods may have a difference according to whether a lateral surface of a chip is required to be coated or not.

Meanwhile, in order to control efficiency of a long wavelength light emitting phosphor re-absorbing light emitted in a short wavelength, among two types of phosphors having different light emitting wavelengths, two types of phosphor layer having different light emitting wavelengths may be provided, and in order to minimize re-absorption and interference of chips and two or more wavelengths, a DBR (ODR) layer may be included between respective layers. In order to form a uniformly coated film, after a phosphor is fabricated as a film or a ceramic form and attached to a chip or a light emitting device.

In order to differentiate light efficiency and light distribution characteristics, a light conversion material may be positioned in a remote form, and in this case, the light conversion material may be positioned together with a material such as a light-transmissive polymer, glass, or the like, according to durability and heat resistance.

A phosphor applying technique plays the most important role in determining light characteristics in an LED device, so techniques of controlling a thickness of a phosphor application layer, a uniform phosphor distribution, and the like, have been variously researched.

A quantum dot (QD) may also be positioned in a light emitting device in the same manner as that of a phosphor, and may be positioned in glass or a light-transmissive polymer material to perform optical conversion.

Meanwhile, in order to protect a light emitting device from an external environment or in order to improve light extraction efficiency of light emitted to the outside of a light emitting device, a light-transmissive material may be positioned on the light emitting device as a filler. In this case, a transparent organic solvent such as epoxy, silicon, a hybrid of epoxy and silicon, or the like, is applied as a light-transmissive material, and the light-transmissive material may be cured according to heating, light irradiation, a time-lapse method, or the like.

In the case of silicon, polydimethyl siloxane is classified as a methyl-based silicon and polymethylphenyl siloxane is classified as a phenyl-based silicon. The methyl-based silicon and the phenyl-based silicon have differences in refractive indexes, water vapor transmission rates, light transmittance amounts, light fastness qualities, and thermostability. Also, the methyl-based silicon and the phenyl-based silicon have differences in curing speeds according to a cross linker and a catalyst, affecting phosphor distribution.

Light extraction efficiency varies according to a refractive index of a filler, and in order to minimize a gap between a refractive index of the outermost medium of a chip in a portion from which blue light is emitted and a refractive index of a portion emitted to air, two or more types of silicon having different refractive indices may be sequentially laminated.

In general, the methyl-based silicon has the highest level of thermostability, and variations in a temperature increase are reduced in order of phenyl-based silicon, hybrid silicon, and epoxy silicon. Silicon may be classified as a gel-type silicon, an elastomer-type silicon, and a resin-type silicon according to the degree of hardness thereof.

The light emitting device may further include an optical element for radially guiding light irradiated from the light emitting device. In this case, a previously formed optical element may be attached to a light emitting device, or a fluidic organic solvent may be injected into a mold with a light emitting device mounted therein and solidified.

The optical element attachment method includes directly attaching an optical element to a filler, bonding only an upper portion of a chip or an outer portion of a light emitting device or an outer portion of the optical element, spaced apart from the filler, and the like. As the method of injecting into a mold, injection molding, transfer molding, compression molding, or the like, may be used. Light distribution characteristics may be changed according to lens shapes (concave, convex, uneven, conical, and geometrical structures), and the optical element may be modified according to efficiency and light distribution characteristics.

The light emitting device may be a single package unit including an LED chip provided therein. Also, the light emitting device may be an LED chip itself. In this case, the LED chip may be a COB type chip mounted on the substrate and directly electrically connected to the substrate through a flip chip bonding method or a wire bonding method.

Figure 15:
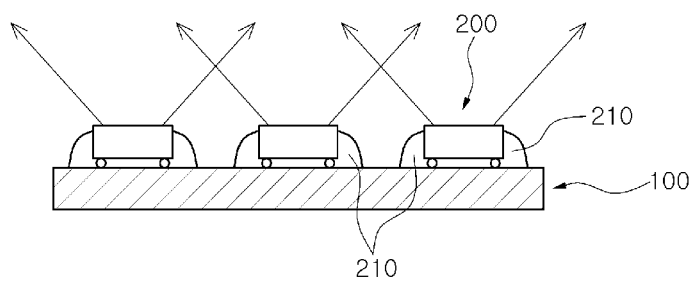
FIG. 15 is a cross-sectional view schematically illustrating a state in which light emitting devices are mounted on a board of FIG. 1.

Also, as illustrated in FIG. 15, a waterproof agent 210 may be formed between the substrate 100 and the light emitting device 200 to surround the ambient regions or sides of the light emitting device 200.

A plurality of light emitting devices 200 may be arranged on the substrate 100 in a length direction. In this case, the light emitting devices 200 may be homogeneous light emitting devices generating light having the same wavelength, such that each light emitting device 200 disposed on the substrate 100 generates light having the same wavelength as other light emitting devices 200 disposed on the substrate 100. Also, the light emitting devices 200 may be heterogeneous light emitting devices generating light having different wavelengths, such that at least one light emitting device 200 disposed on the substrate 100 generates light having a different wavelength from another light emitting device 200 disposed on the substrate 100. The plurality of light emitting devices 200 may be spaced apart from one another with predetermined intervals therebetween and arranged in a row.

The lens 300 may extend in the length direction in which the plurality of light emitting devices 200 are aligned to integrally cover the substrate 100 and the plurality of light emitting devices 200.

As illustrated in FIG. 2B, when the lens 300 is viewed in a cross-section taken along a shorter-axis direction of the lens 300, a pair of facing sides of the lens 300 are parallel to each other, and portions connecting both facing sides in an upper portion of the light emitting device 200 have convex curved surfaces protruded upwardly from the light emitting device 200, forming an arch-like cross-sectional shape.

Both facing sides of the lens 300 may extend in parallel in a longer-axis direction, i.e., in the length direction, with the plurality of light emitting devices 200 arranged in a row along the length direction and placed between the facing sides. Both end sides of the lens 300 in the longer-axis direction may be open (as shown in FIGS. 1 and 16A), forming a tunnel-like structure on the whole.

Figure 16:
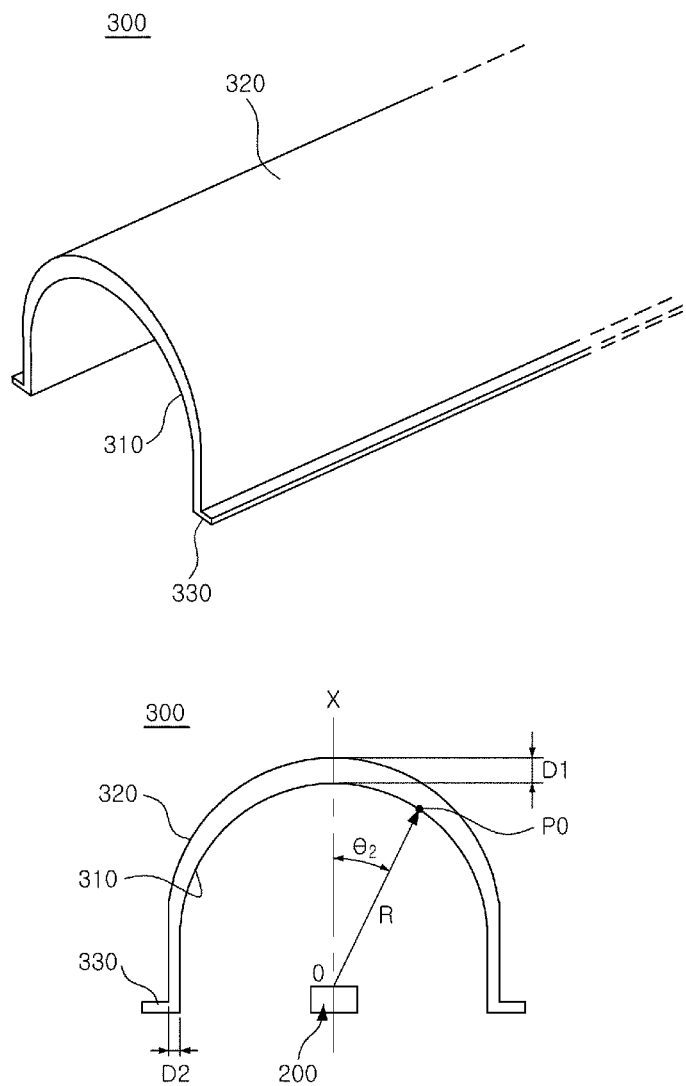
FIGS. 16A and 16B are a perspective view and a cross-sectional view schematically illustrating a lens of FIG. 1.

Outwardly protruded flange portions 330 may be formed on the bottom of the lens 300, namely, on the bottom of both sides thereof, respectively, as shown in FIG. 16A.

The lens 300 may have a first surface 310 to which light from the plurality of light emitting devices 200 is made incident and a second surface 320 from which is emitted outwardly the light made incident through the first surface 310. The first surface 310 and the second surface 320 may correspond to an inner surface and an outer surface of the lens 300, respectively. A distance between the first surface 310 and the second surface 320 may be defined as a thickness of the cross-section of the lens 300. In some embodiments, the thickness of the lens at a given point on the first surface 310 is defined as the minimum distance between the first surface 310 and the second surface 320 at the given point.

Meanwhile, in the present embodiment, the distance between the first surface 310 and the second surface 320, defining the thickness of the cross-section of the lens 300, differs in portions through which an optical axis X of the light emitting device 200 passes and the other remaining portions.

In detail, as illustrated in FIG. 16B showing a cross-section of the light source module 10 along a plane orthogonal to a long-axis of the lens 300, the lens 300 has a structure in which a distance between the first surface 310 and the second surface 320, i.e., the thickness of the lens 300, in the shorter-axis direction, is decreased from the center of the lens 300 (e.g., at a point of intersection with respect to the optical axis X, which corresponds to an axis of symmetry of the lens 300) toward both lateral sides of the lens 300. Namely, a thickness D1 of the lens 300 is greatest in the center position directly above the light emitting device 200, through which the optical axis X passes. The thickness of the lens 300 decreases toward both lateral sides of the lens 300 to reach the thickness D2 (D2<D1), having an asymmetrical structure.

In this case, the lens 300 may have a structure in which the thickness D1 in the center thereof is thicker than the thickness D2 on both lateral sides thereof by n times (1<n≤2). For example, the thickness D2 in the sides of the lens 300 may be approximately 1 mm, while the thickness D1 in the center of the lens 300 may be approximately 2 mm.

The lens 300 may have a cross-section having an arch-like cross sectional shape. In this case, the lens 300 may have a semi-oval shape in which a length of the oval in the optical axis direction (i.e., a height of the lens 300 above the device 200) is greater that a width of the oval (i.e., a distance between the device 200 and a side of the lens 300 in a lateral or horizontal direction). The lens 300 may thus have a semi-oval shape rather than having a semi-cylindrical shape in which distances from a rotation central axis are equal.

In detail, as illustrated in FIG. 16B, a configuration of the first surface 310 of the lens 300 may satisfy the following condition:

Condition: Length of R is decreased as θ2 is increased within a range of θ2>0°.

Here, in a case in which an intersection point of the optical axis X and a light emitting surface of the light emitting device 200 is defined as a reference point 'O', 'R' is a straight line connecting the reference point and a certain point P0 of the first surface 310, and θ2 is an angle between the straight line 'R' and the optical axis X.

Namely, in the case of θ2=0°, the straight line conforms with the optical axis X. As the angle θ2 is increased, a length of R is decreased.

In this manner, the thickness of the cross-section of the lens 300 is not equal on the whole, the thickness of the center of the lens 300 is greater than the thickness of the other ambient portions, and the cross-section has a semi-oval arch shape whereby a light distribution angle of light irradiated outwardly through the lens 300 can be increased.

Figure 17:
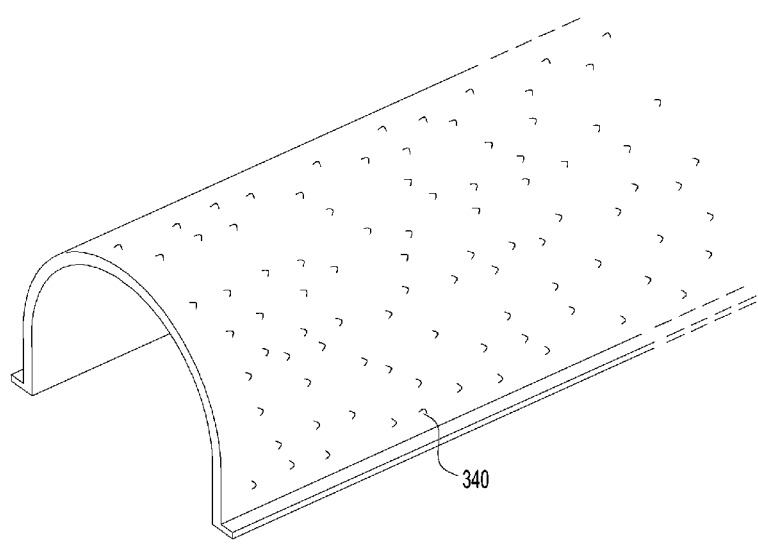
FIG. 17 is a perspective view schematically illustrating a modification of FIG. 16.

Meanwhile, as illustrated in FIG. 17, the lens 300 may have a concavo-convex structure 340 formed on a surface of at least one of the first surface 310 and the second surface 320. The concavo-convex structure 340 may serve to increase light scattering and light diffusion on the surface of the lens 300 and allows light to be more uniformly and widely irradiated outwardly.

The lens 300 may be made of a resin material having translucency or transparency. For example, the material having translucency or transparency may include polycarbonate (PC), polymethylmetacrylate (PMMA), or the like. Also, the lens 300 may be made of a glass material, but the present invention is not limited thereto.

The lens 300 may be formed by injecting a fluidic organic solvent into a mold and solidifying the same. For example, injection molding, transfer molding, compression molding, or the like, may be used.

The lens 300 may contain a light dispersion material in the amount of 3% to 15%. The light dispersion material may include one or more of materials selected from the group consisting of $SiO_2$, $TiO_2$, and $Al_2O_3$, for example. If the light dispersion material is contained in the amount of less than 3%, light may not be sufficiently dispersed and light dispersion effect cannot be counted on. If the light dispersion material is contained in the amount of more than 15%, an amount of light discharged outwardly through the lens 300 is reduced to degrade light extraction efficiency.

Figure 18A:
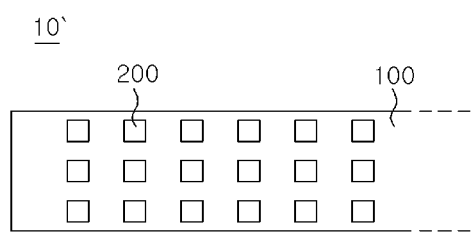
FIGS. 18A and 18B are plan views schematically illustrating a light source module according to another exemplary embodiment of the present application.
Figure 18B:
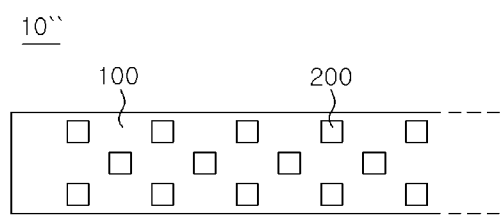

Light source modules according to other embodiments of the present application will be described with reference to FIGS. 18A and 18B. FIGS. 18A and 18B are plan views schematically illustrating light source modules according to other embodiments of the present application.

The configuration of the light source modules according to the embodiments illustrated in FIGS. 18A and 18B basically have substantially the same structure as that of the embodiment illustrated in FIG. 1, except for a layout pattern of light emitting devices 200 on the substrate 100. Thus, hereinafter, descriptions of the same parts as those of the former embodiment will be omitted and the layout pattern of light emitting devices 200 will be largely described.

As illustrated in FIG. 18A, the plurality of light emitting devices 200 may be arranged along a plurality of parallel lines in a length direction of the substrate 100 to form a plurality of rows. In this case, the respective light emitting devices 200 may be arranged in rows and columns, having a matrix form. In the embodiment, it is illustrated that a plurality of light emitting devices 200 are aligned in the length direction of the substrate 100 to form three lines, but the present invention is not limited thereto. For example, the light emitting devices may be variously modified; they may form two lines or four or more lines.

Meanwhile, as illustrated in FIG. 18B, the respective light emitting devices 200 may be alternately positioned in different adjacent rows, so as to form a checker board arrangement in which devices 200 form zigzag patterns on the substrate.

FIGS. 18A and 18B illustrate light source modules 10' and 10" in which lens 300 is not shown, to describe the arrangement structures of the light emitting devices 200. However, the lens 300 is not shown for the sake of convenience and a lens 300 covering the plurality of light emitting devices 200 on each substrate 100 may be disposed above the substrates 100 and the light emitting devices 200 arranged as described above.

A lighting device according to an embodiment of the present invention will be described with reference to FIGS. 19 and 20.

Figure 19:
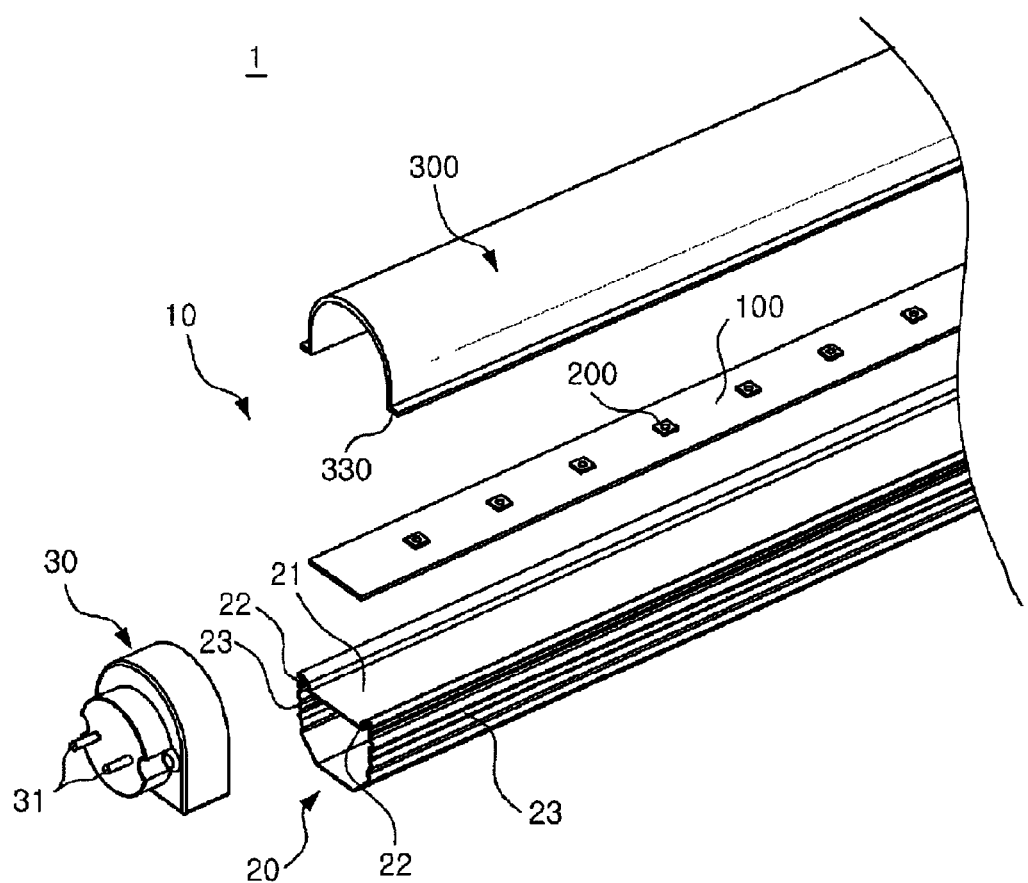
FIG. 19 is an exploded perspective view schematically illustrating a lighting device according to an exemplary embodiment of the present application.
Figure 20:
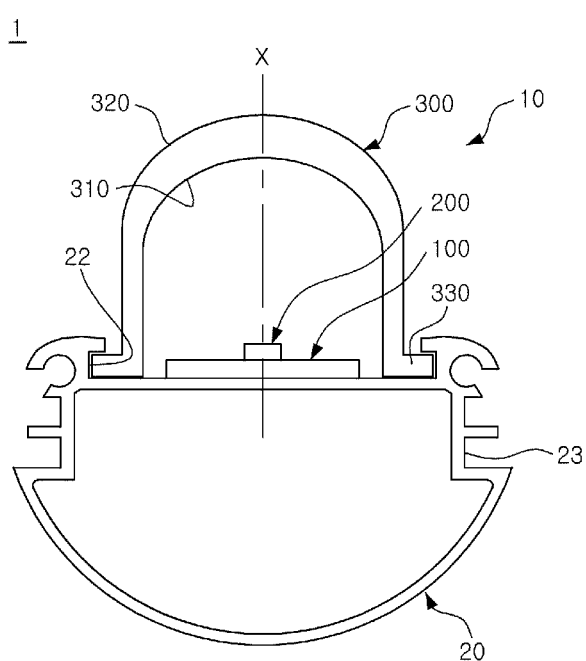
FIG. 20 is a cross-sectional view of the lighting device of FIG. 19.

FIG. 19 is an exploded perspective view schematically illustrating a lighting device according to an embodiment of the present application, and FIG. 20 is a cross-sectional view of the lighting device of FIG. 19.

As illustrated in FIGS. 19 and 20, a lighting device 1 according to an embodiment of the present application may include a light source module 10, a body unit 20, and a terminal unit 30.

The light source module 10 may include the substrate 100, a plurality of light emitting devices 200 aligned on the substrate 100, and the lens 300 extending in the direction in which the plurality of light emitting devices 200 are aligned to cover substrate 100 and the plurality of light emitting devices 200. Both end sides of the lens 300 in the longer-axis direction are open.

Configurations of the lens 300 and the light source module 10 having the lens 300 can be the same as the configurations of the light source modules 10, 10', and 10" illustrated in FIGS. 1, 2A, 2B, 16A, 16B, 17, and 18, so a detailed description of the light source module 10 will be omitted.

The body unit 20 may be configured to have the light source module 10 fixed to one surface thereof. The body unit 20 can serve as a type of support structure, and may include a heat sink. The body unit 20 may be made of a material having excellent heat conductivity to dissipate heat generated by the light source module 10 outwardly. For example, the body unit 20 may be made of a metal, but the present invention is not limited thereto.

The body unit 20 may have an elongated bar-like shape corresponding to the shape of the substrate 100 of the light source module 10 on the whole. The body unit 20 may have a recess 21 formed on one surface thereof to accommodate the light source module 10 therein.

Stoppage grooves 22 may be formed in both side edges of the recess 21 and extend in the length direction of the body unit 20. The flange portions 330 of the lens 300 may be detachably fastened to or slid into the stoppage grooves 22.

Guide recesses 23 may be formed on both outer surfaces of the body unit 20 and extend in the length direction of the body unit 20.

Meanwhile, both end portions of the body unit 20 in the length direction may be open, so the body unit 20 may have a pipe structure with both end portions thereof open. In the present embodiment, the body unit 20 having both open end portions is illustrated, but the present invention is not limited thereto. For example, only one of the end portions of the body unit 20 may be open in other embodiments.

The terminal unit 30 may be provided in at least one of the opened end portions of the body unit 20 to receive power from the outside. In the present embodiment, both end portions of the body unit 20 are open, so the terminal unit 30 is illustrated as being disposed in both end portions of the body unit 20. However, the present embodiment is not limited thereto and, when the body unit 20 has a structure in which only one side thereof is open, the terminal unit 30 may be provided in only the open end portion among both end portions of the body unit 20.

Figure 23:
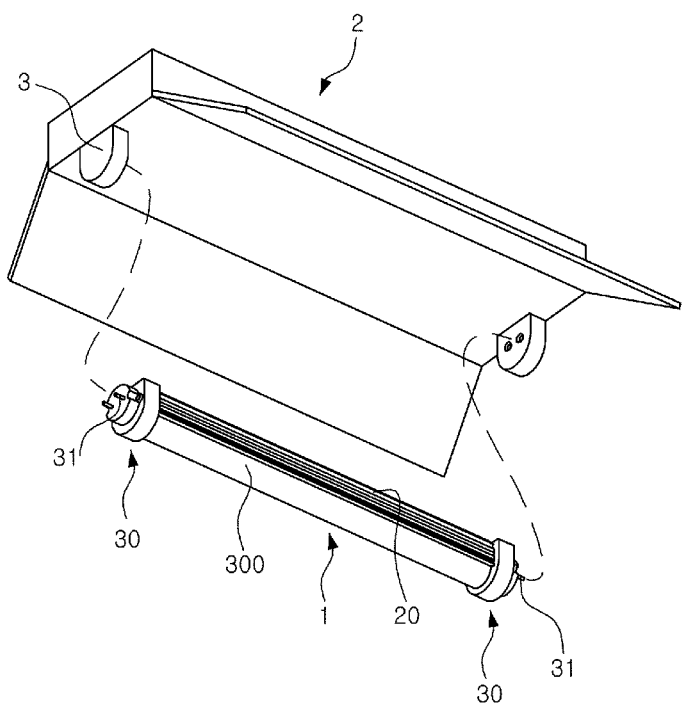
FIG. 23 is a perspective view schematically illustrating a fixing structure in which a lighting device is installed.

The terminal unit 30 may be fastened to both open end portions of the body unit 20 to cover and close them. The terminal unit 30 may include electrode pins 31 protruded outwardly. As illustrated in FIG. 23, when the lighting device 1 is installed in a lighting device unit 2, the terminal unit 30 may be physically fastened and electrically connected to a socket 3 through the electrode pins 31. The terminal unit 30 may receive power from the socket 3 through the electrode pins 31, and may supply power to the light source module 10.

Figure 21:
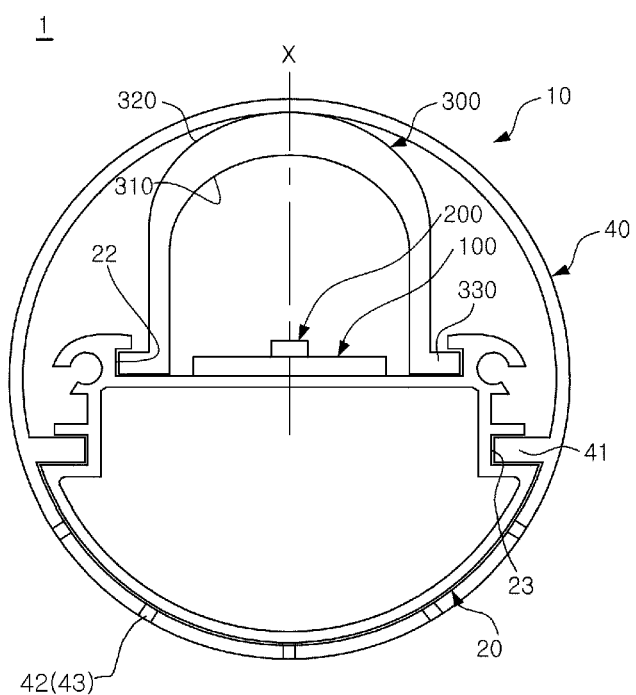
FIG. 21 is a cross-sectional view schematically illustrating a lighting device according to another exemplary embodiment of the present application.

FIG. 21 schematically illustrates a lighting device according to another embodiment of the present application. The structure of the lighting device according to the embodiment illustrated in FIG. 21 is substantially similar to the basic structure of the embodiment illustrated in FIG. 20, except for a cover unit fixing the body unit. Thus, hereinafter, descriptions of components the same as or similar to those of the former embodiment will be omitted and the cover unit will be mainly described.

FIG. 21 is a cross-sectional view schematically illustrating a lighting device according to another embodiment of the present application. The lighting device 1 according to the present embodiment may further include a cover unit 40 within which the body unit 20 is fixed.

The cover unit 40 covers the body unit 20 and is insertedly fixed therein. In detail, the cover unit 40 may have a cylindrical shape and extend in the length direction of the light source module 10 and the body unit 20 to accommodate the light source module 10 and the body unit 20 in an internal space thereof.

In the present embodiment, the cover unit 40 is illustrated to have a hollow pipe structure having a cylindrical shape to correspond to the structure of a fluorescent lamp, but the present embodiment is not limited thereto. The shape of the cover unit 40 may be variously modified to have a square pillar shape, or the like, according to an illumination design for irradiating light.

The cover unit 40 may have a plurality of guides 41 formed as protrusions on an inner surface of the cover unit to contact with the body unit 20. The guides 41 may be detachably or slidably inserted into guide recesses 23 formed on an outer surface of the body unit 20, and may thereby fix the body unit 20 within the cover unit 40. Thus, in a state in which the guides 41 are engaged in the guide recesses 23, the body unit 20 may be slidably drawn into or out of the cover unit 40 but may be prevented from rotating within the cover unit 40.

Meanwhile, the cover unit 40 may include a plurality of heat dissipation slits 42 or a plurality of heat dissipation holes 43 formed in portions thereof in contact with, in close proximity to, or facing the body unit 20. The plurality of heat dissipation slits 42 or heat dissipation holes 43 may penetrate through the cover unit 40 and extend in or be arranged along a length direction of the cover unit 40.

The plurality of heat dissipation slits 42 or heat dissipation holes 43 may serve to quickly dissipate heat generated by the light source module 10 and transferred to the body unit 20 outwardly out of the cover unit 40.

Although not shown, the body unit 20 may further include a plurality of heat dissipation fins to enhance heat dissipation efficiency. The heat dissipation fins may protrude outwardly from the cover unit 40 through the plurality of heat dissipation slits 42 or the plurality of heat dissipation holes 43 so as to be exposed to the ambient air.

The cover unit 40 may be made of a material allowing light to be transmitted therethrough. For example, the cover unit 40 may be made of the substantially same material as that of the lens 300 of the light source module 10.

Figure 22:
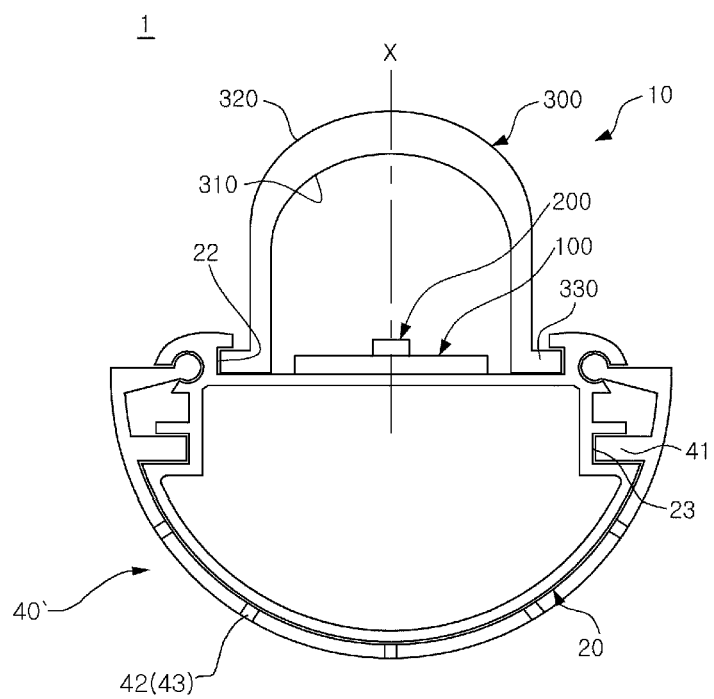
FIG. 22 is a view illustrating a modification of FIG. 21.

FIG. 22 schematically illustrates a modification of the lighting device of FIG. 21. The lighting device according to a modification illustrated in FIG. 22 has a similar structure to that illustrated in FIG. 21, except for a cover unit.

As illustrated in FIG. 22, a cover unit 40' has a cross-section having a semicircular container-like shape, which is different from the cylindrical hollow pipe-like shape of the cover unit 40 according to the embodiment illustrated in FIG. 21.

The cover unit 40' may cover most of the body unit 20, excluding a region in which the light source module 10 is installed. The light source module 10 may be directly exposed to the outside, rather than being covered by the cover unit 40'. In this case, the light source module 10 mounted to the body unit 20 may be easily replaced with a different light source module 10 in a state in which the body unit 20 is fastened to the cover unit 40' as replacing the light source module 10 does not require uninstalling a cover unit 40 from the body unit 20. Thus, maintenance of a lighting device can be facilitated.

Similarly, the cover unit 40' may have a plurality of heat dissipation slits 42 or a plurality of heat dissipation holes 43 formed in portions thereof in contact with, in close proximity to, or facing the body unit 20 such that they penetrate through the cover unit 40' in order to enhance heat dissipation efficiency.

The cover units 40 and 40' may be made of an insulating material such as a resin and cover the body unit 20. Thus, in comparison to a structure in which the body unit 20 is directly exposed to the outside, electrical stability can be secured. Also, a user may be prevented from coming into direct contact with the body unit 20, reducing a risk of getting burned.

FIG. 23 schematically illustrates a fixing structure in which the lighting device is installed.

As illustrated in FIG. 23, when the lighting device 1 is installed in the fixing structure 2, the terminal unit 30 may be physically fastened and electrically connected to the sockets 3 provided in both ends of the fixing structure 2 through the electrode pins 31. Also, the terminal unit 30 may supply power received from the sockets 3 through the pins 31 to the light source unit 10.

The fixing structure 2 may be fixed to the ceiling of a building, or the like, for example, and include a power supply unit (PSU), or the like, to stably supply driving power from the outside. The fixing structure 2 may have a reflector on a surface thereof facing the sockets 3 and a lighting device 1 mounted therein.

Figure 24A:
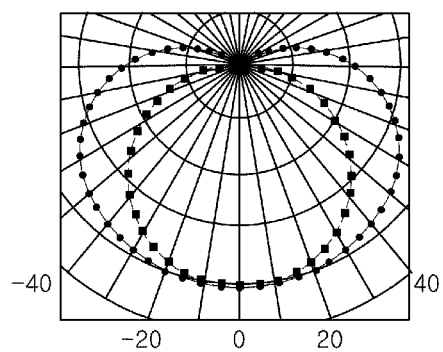
FIGS. 24A and 24B are graphs showing light distribution curves of a lighting device.

FIG. 24A illustrates light distribution curves of the lighting device 1. In the graph of the light distribution curves illustrated in FIG. 1, a light distribution region of the lighting device 1 is shown by a series of circular dots, and has a light distribution angle equal to or greater than 180° (degrees). Thus, it can be seen that the light distribution angle is similar to a light distribution structure of a fluorescent lamp, in comparison to the conventional lamp structure having a light distribution angle of approximately 140° as shown by the series of square dots.

Figure 24B:
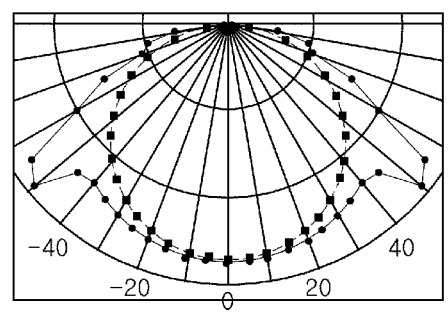

FIG. 24B is a graph illustrating light distribution curves obtained when the lighting device 1 is installed in the fixing structure 2 and fixed to the ceiling. In this case, a spatial criteria (SC) of the lighting device 1 is approximately 1.6, which is substantially equal to that of a fluorescent lamp. In comparison, SC of the conventional lamp structure is 1.3, different from that of the fluorescent lamp.

Figure 25:
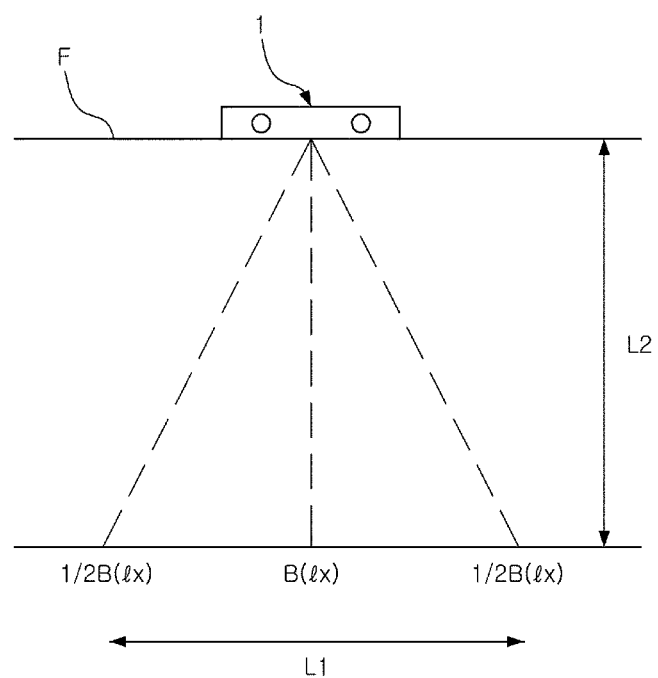
FIG. 25 is a view schematically illustrating a state in which a lighting device is installed on the ceiling to irradiate light.

FIG. 25 schematically illustrates a state in which the lighting device 1 is installed on the ceiling to irradiate light. The spatial criteria (SC) is defined as a value obtained by a ratio L1/L2 obtained by dividing a distance L1 between two points of the bottom at which intensity of illumination is half (½B (lx)) of conical illuminance B(lx) when the lighting device 1 is disposed on the ceiling F having a height L2 by L2.

The lighting device 1 using the LED as described above may be classified as an indoor lighting device or an outdoor lighting device according to the purpose thereof. The indoor LED lighting device may include a lamp, a fluorescent lamp (LED-tube), a flat panel type lighting device replacing an existing lighting fixture (retrofit), and the outdoor LED lighting device may include a streetlight, a security light, a flood light, a scene lamp, a traffic light, and the like.

Also, the lighting device using the LED may be utilized as an internal or external light source of a vehicle. As an internal light source, the lighting device using the LED may be used as an indoor light of a vehicle, a reading light, or as various dashboard light sources. As an external light source, the lighting device using the LED may be used as a light source in vehicle lighting fixture such as a headlight, a brake light, a turn signal lamp, a fog light, a running light, and the like.

In addition, the LED lighting device may also be applicable as a light source used in robots or various mechanic facilities. In particular, LED lighting using light within a particular wavelength band may accelerate plant growth, and stabilize a user's mood or treat a disease using sensitivity (or emotional) illumination (or lighting).

A lighting system employing the foregoing lighting device will be described with reference to FIGS. 26 through 29. The lighting system according to the present embodiment may automatically regulate a color temperature according to a surrounding environment (e.g., temperature and humidity) and provide a lighting device as sensitivity lighting meeting human sensitivity, rather than serving as simple lighting.

Figure 26:
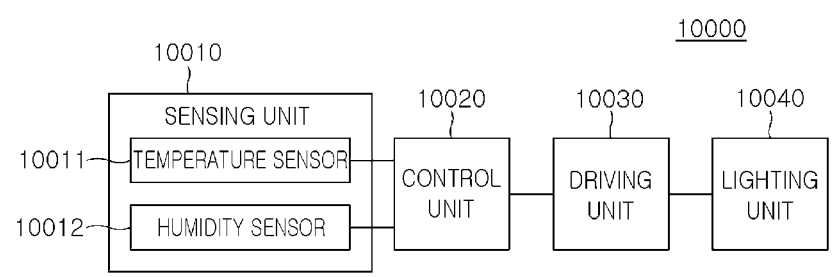
FIG. 26 is a block diagram schematically illustrating a lighting system according to an exemplary embodiment of the present application.

FIG. 26 is a block diagram schematically illustrating a lighting system according to an embodiment of the present application.

Referring to FIG. 26, a lighting system 10000 according to an embodiment of the present application may include a sensing unit 10010, a control unit 10020, a driving unit 10030, and a lighting unit 10040.

The sensing unit 10010 may be installed in an indoor or outdoor area, and may have a temperature sensor 10011 and a humidity sensor 10012 to measure at least one air condition among an ambient temperature and humidity. The sensing unit 10010 delivers the measured air condition, i.e., the measured temperature and humidity, to the control unit 10020 electrically connected thereto.

The control unit 10020 may compare the measured air temperature and humidity with air conditions (temperature and humidity ranges) previously set by a user, and determines a color temperature of the lighting unit 10040 corresponding to the air condition. To this end, the control unit 10020 may be electrically connected to the driving unit 10030, and control the lighting unit 10040 to be driven at the determined color temperature.

Figure 27:
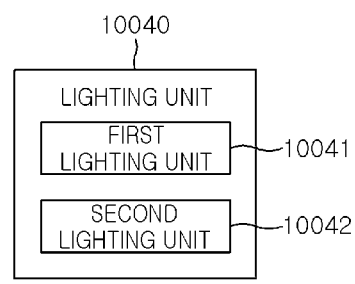
FIG. 27 is a block diagram schematically illustrating a detailed configuration of a lighting unit of the lighting system illustrated of FIG. 26.

The lighting unit 10040 operates according to power supplied by the driving unit 10030. The lighting unit 10040 may include at least one lighting device illustrated in FIGS. 20 to 22. For example, as illustrated in FIG. 27, the lighting unit 10040 may include a first lighting device 10041 and a second lighting device 10042 having different color temperatures, and each of the lighting devices 10041 and 10042 may include a plurality of light emitting devices emitting the same white light.

The first lighting device 10041 may emit white light having a first color temperature, and the second lighting device 10042 may emit white light having a second color temperature, and here, the first color temperature may be lower than the second color temperature. Conversely, the first color temperature may be higher than the second color temperature. Here, white color having a relatively low color temperature corresponds to a warm white color, and white color having a relatively high color temperature corresponds to a cold white color. When power is supplied to the first and second lighting devices 10041 and 10042, the first and second lighting devices 10041 and 10042 emit white light having first and second color temperatures, respectively, and the respective white light may be mixed to implement white light having a color temperature determined by the control unit 10020.

In detail, in a case in which the first color temperature is lower than the second color temperature, if the color temperature determined by the control unit 10020 is relatively high, an amount of light from the first lighting device 10041 may be reduced and an amount of light from the second lighting device 10042 may be increased to implement mixed white light having the determined color temperature. Conversely, when the determined color temperature is relatively low, an amount of light from the first lighting device 10041 may be increased and an amount of light from the second lighting device 10042 may be reduced to implement white light having the determined color temperature. Here, the amount of light from each of the lighting devices 10041 and 10042 may be implemented by differently regulating an amount of power supplied from the driving unit 10030 or may be implemented by regulating the number of lighted light sources.

Figure 28:
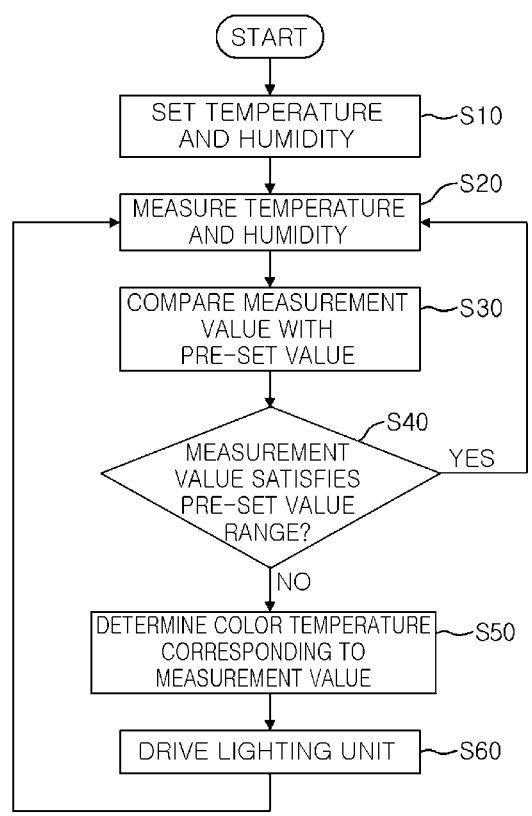
FIG. 28 is a flow chart illustrating a method for controlling the lighting system illustrated of FIG. 26.

FIG. 28 is a flowchart illustrating a method for controlling the lighting system of FIG. 26. Referring to FIG. 28, first, the user sets a color temperature according to temperature and humidity ranges through the control unit 10020 (S10). The set temperature and humidity data are stored in the control unit 10020.

In general, when a color temperature is equal to or more than 6000K, a color providing a cool feeling, such as blue, may be produced, and when a color temperature is less than 4000K, a color providing a warm feeling, such as red, may be produced. Thus, in the present embodiment, when temperature and humidity exceed 20° C. and 60%, respectively, the user may set the lighting unit 10040 to be turned on to have a color temperature higher than 6000K through the control unit 10020, when temperature and humidity range from 10° C. to 20° C. and 40% to 60%, respectively, the user may set the lighting unit 10040 to be turned on to have a color temperature ranging from 4000K to 6000K through the control unit 10020, and when temperature and humidity are lower than 10° C. and 40%, respectively, the user may set the lighting unit 10040 to be turned on to have a color temperature lower than 4000K through the control unit 10020.

Next, the sensing unit 10010 measures at least one of conditions among ambient temperature and humidity (S20). The temperature and humidity measured by the sensing unit 10010 are delivered to the control unit 10020.

Subsequently, the control unit 10020 compares the measurement values delivered from the sensing unit 10010 with pre-set values, respectively (S30). Here, the measurement values are temperature and humidity data measured by the sensing unit 10010, and the set values are temperature and humidity data which have been set by the user and stored in the control unit 10020 in advance. Namely, the control unit 10020 compares the measured temperature and humidity with the pre-set temperature and humidity.

According to the comparison results, the control unit 10020 determines whether the measurement values satisfy the pre-set ranges (S40). When the measurement values satisfy the pre-set values, the control unit 10020 maintains a current color temperature, and measures again temperature and humidity (S20). Meanwhile, when the measurement values do not satisfy the pre-set values, the control unit 10020 detects pre-set values corresponding to the measurement values, and determines a corresponding color temperature (S50). The control unit 10020 controls the driving unit 10030 to cause the lighting unit 10040 to be driven at the determined color temperature.

Then, the driving unit 10030 drives the lighting unit 10040 to have the determined color temperature (S60). That is, the driving unit 10030 supplies required power to drive the lighting unit 10040 to implement the predetermined color temperature. Accordingly, the lighting unit 10040 may be adjusted to have a color temperature corresponding to the temperature and humidity previously set by the user according to ambient temperature and humidity.

In this manner, the lighting system 10000A is able to automatically regulate a color temperature of the indoor lighting according to changes in ambient temperature and humidity, thereby satisfying human moods varied according to changes in the surrounding natural environment and providing psychological stability.

FIG. 29 is a view schematically illustrating the use of the lighting system of FIG. 26. As illustrated in FIG. 29, the lighting unit 10040 may be installed on the ceiling as an indoor lamp. Here, the sensing unit 10010 may be may be implemented as a separate device and installed on an external wall in order to measure outdoor temperature and humidity. The control unit 10020 may be installed in an indoor area to allow the user to easily perform setting and ascertainment operations. The lighting system is not limited thereto, but may be installed on the wall in the place of an interior illumination device or may be applicable to a lamp, such as a desk lamp, or the like, that can be used in indoor and outdoor areas.

Hereinafter, another example of a lighting system using the foregoing lighting device will be described with reference to FIGS. 30 through 33. The lighting system according to the present embodiment may automatically perform a predetermined control by detecting a motion of a monitored target and an intensity of illumination at a location of the monitored target.

FIG. 30 is a block diagram of a lighting system according to another embodiment of the present application.

Referring to FIG. 30, a lighting system 10000' according to the present embodiment may include a wireless sensing module 10100 and a wireless lighting controlling device 10200.

The wireless sensing module 10100 may include a motion sensor 10110, an illumination intensity sensor 10120 sensing an intensity of illumination, and a first wireless communications unit generating a wireless signal that includes a motion sensing signal from the motion sensor 10110 and an illumination intensity sensing signal from the illumination intensity sensor 10120 and that complies with a predetermined communications protocol, and transmitting the same. For example, the first wireless communications unit may be configured as a first ZigBee communications unit 10130 generating a ZigBee signal that complies with a pre-set communications protocol and transmitting the same.

The wireless lighting controlling device 10200 may include a second wireless communications unit receiving the wireless signal from the first wireless communications unit and restoring a sensing signal, a sensing signal analyzing unit 10220 analyzing the sensing signal from the second wireless communications unit, and an operation control unit 10230 performing a predetermined control based on analysis results from the sensing signal analyzing unit 10220. The second wireless communications unit may be configured as a second ZigBee communications unit 10210 receiving the ZigBee signal from the first ZigBee communications unit and restoring a sensing signal.

FIG. 31 is a view illustrating a format of a ZigBee signal according to an embodiment of the present application.

Referring to FIG. 31, the ZigBee signal from the first ZigBee communications unit 10130 may include channel information (CH) defining a communications channel, wireless network identification (ID) information (PAN_ID) defining a wireless network, a device address (Ded_Add) designating a target device, and sensing data including the motion and illumination intensity sensing signal.

Also, the ZigBee signal from the second ZigBee communications unit 10210 may include channel information (CH) defining a communications channel, wireless network identification (ID) information (PAN_ID) defining a wireless network, a device address (Ded_Add) designating a target device, and sensing data including the motion and illumination intensity sensing signal.

The sensing signal analyzing unit 10220 may analyze the sensing signal from the second ZigBee communications unit 10210 to detect a satisfied condition, among a plurality of conditions, based on the sensed motion and the sensed intensity of illumination.

Here, the operation control unit 10230 may set a plurality of controls based on the plurality of conditions that are previously set by the sensing signal analyzing unit 10220, and perform a control corresponding to the condition detected by the sensing signal analyzing unit 10220.

Figure 32:
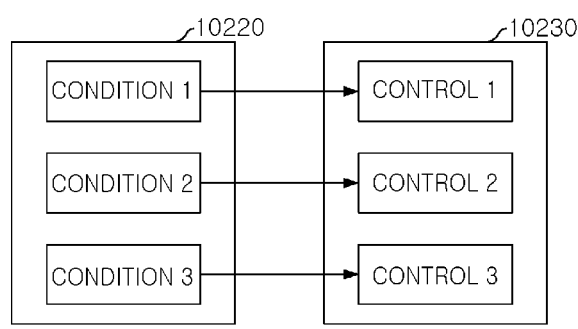
FIG. 32 is a view illustrating a sensing signal analyzing unit and an operation control unit according to an exemplary embodiment of the present application.

FIG. 32 is a view illustrating the sensing signal analyzing unit and the operation control unit according to the embodiment of the present application. Referring to FIG. 32, for example, the sensing signal analyzing unit 10220 may analyze the sensing signal from the second ZigBee communications unit 10210 and detect a satisfied condition among first, second, and third conditions (condition 1, condition 2, and condition 3), based on the sensed motion and sensed intensity of illumination.

In this case, the operation control unit 10230 may set first, second and third controls (control 1, control 2, and control 3) corresponding to the first, second, and third conditions (condition 1, condition 2, and condition 3) previously set by the sensing signal analyzing unit 10220, and perform a control corresponding to the condition detected by the sensing signal analyzing unit 10220.

Figure 33:
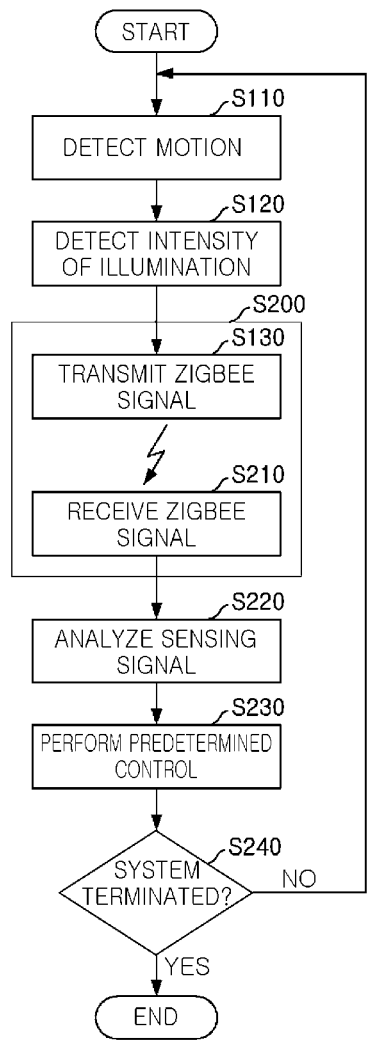
FIG. 33 is a flow chart illustrating an operation of a wireless lighting system according to an exemplary embodiment of the present application.

FIG. 33 is a flowchart illustrating an operation of a wireless lighting system according to an embodiment of the present application.

In FIG. 33, in operation S110, the motion sensor 10110 detects a motion. In operation S120, the illumination intensity sensor 10120 detects an intensity of illumination. Operation 5200 is a process of transmitting and receiving a ZigBee signal. Operation 5200 may include operation S130 of transmitting a ZigBee signal by the first ZigBee communications unit 10130 and operation S210 of receiving the ZigBee signal by the second ZigBee communications unit 10210. In operation S220, the sensing signal analyzing unit 10220 analyzes a sensing signal. In operation S230, the operation control unit 10230 performs a predetermined control. In operation 5240, whether the lighting system is terminated is determined.

Operations of the wireless sensing module and the wireless lighting controlling device according to an embodiment of the present application will be described with reference to FIGS. 30 through 33.

First, with reference to FIGS. 30, 31, and 33, the wireless sensing module 10100 of the wireless lighting system according to an embodiment of the present application will be described. The wireless lighting system 10100 according to the present embodiment is installed in a location in which a lighting device is installed, to detect a current intensity of illumination of the lighting device and detect human motion near the lighting device.

Namely, the motion sensor 10110 of the wireless sensing module 10100 is configured as an infrared sensor, or the like, capable of sensing a human. The motion sensor 10100 senses a motion and provides the same to the first ZigBee communications unit 10130 (S110 in FIG. 33). The illumination intensity sensor 10120 of the wireless sensing module 10100 senses an intensity of illumination and provides the same to the first ZigBee communications unit 10130 (S120).

Accordingly, the first ZigBee communications unit 10130 generates a ZigBee signal that includes the motion sensing signal from the motion sensor 10100 and the illumination intensity sensing signal from the illumination intensity sensor 10120 and that complies with a pre-set communications protocol, and transmits the generated ZigBee signal wirelessly (S130).

Referring to FIG. 31, the ZigBee signal from the first ZigBee communications unit 10130 may include channel information (CH) defining a communications channel, wireless network identification (ID) information (PAN_ID) defining a wireless network, a device address (Ded_Add) designating a target device, and sensing data, and here, the sensing data includes a motion value and an illumination intensity value.

Next, the wireless lighting controlling device 10200 of the wireless lighting system according to an embodiment of the present invention will be described with reference to FIGS. 30 through 33. The wireless lighting controlling device 10200 of the wireless lighting system according to the present embodiment may control a predetermined operation according to an illumination intensity value and a motion value included in a ZigBee signal from the wireless sensing module 10100.

Namely, the second ZigBee communications unit 10210 of the wireless lighting controlling device 10200 according to the present embodiment receives the ZigBee signal from the first ZigBee communications unit 10130, restores a sensing signal therefrom, and provides the restored sensing signal to the sensing signal analyzing unit 10200 (S210 in FIG. 33).

Referring to FIG. 31, the ZigBee signal from the second ZigBee communications unit 10210 may include channel information (CH) defining a communications channel, wireless network identification (ID) information (PAN_ID) defining a wireless network, a device address (Ded_Add) designating a target device, and sensing data. A wireless network may be identified based on the channel information (CH) and the wireless network ID information (PAN_ID), and a sensed device may be recognized based on the device address. The sensing data includes a motion value and an illumination intensity value.

Also, referring to FIG. 30, the sensing signal analyzing unit 10220 analyzes the illumination intensity value and the motion value included in the sensing signal from the second ZigBee communications unit 10210 and provides the analysis results to the operation control unit 10230 (S220 in FIG. 33).

Accordingly, the operation control unit 10230 may perform a predetermined control according to the analysis results from the sensing signal analyzing unit 10220 (S230).

The sensing signal analyzing unit 10220 may analyze the sensing signal form the second ZigBee communications unit 10210 and detect a satisfied condition, among a plurality of conditions, based on the sensed motion and the sensed intensity of illumination. Here, the operation control unit 10230 may set a plurality of controls corresponding to the plurality of conditions set in advance by the sensing signal analyzing unit 10220, and perform a control corresponding to the condition detected by the sensing signal analyzing unit 10220.

For example, referring to FIG. 32, the sensing signal analyzing unit 10220 may detect a satisfied condition among the first, second, and third conditions (condition 1, condition 2, and condition 3) based on the sensed motion and the sensed intensity of illumination by analyzing the sensing signal from the second ZigBee communications unit 10210.

In this case, the operation control unit 10230 may set first, second, and third controls (control 1, control 2, and control 3) corresponding to the first, second, and third conditions (condition 1, condition 2, and condition 3) set in advance by the sensing signal analyzing unit 10220, and perform a control corresponding to the condition detected by the sensing signal analyzing unit 10220.

For example, when the first condition (condition 1) corresponds to a case in which human motion is sensed at a front door and an intensity of illumination at the front door is not low (not dark), the first control may turn off all predetermined lamps. When the second condition (condition 2) corresponds to a case in which human motion is sensed at the front door and an intensity of illumination at the front door is low (dim), the second control may turn on some pre-set lamps (i.e., some lamps at the front door and some lamps in a living room). When the third condition (condition 3) corresponds to a case in which human motion is sensed at the front door and an intensity of illumination at the front door is very low (a very dark environment), the third control may turn on all the pre-set lamps.

Unlike the foregoing cases, besides the operation of turning lamps on or off, the first, second, and third controls may be variously applied according to pre-set operations. For example, the first, second, and third controls may be associated with operations of a lamp and an air-conditioner in summer or may be associated with operations of a lamp and heating in winter.

Other examples of a lighting system will be described with reference to FIGS. 34 through 37.

Figure 34:
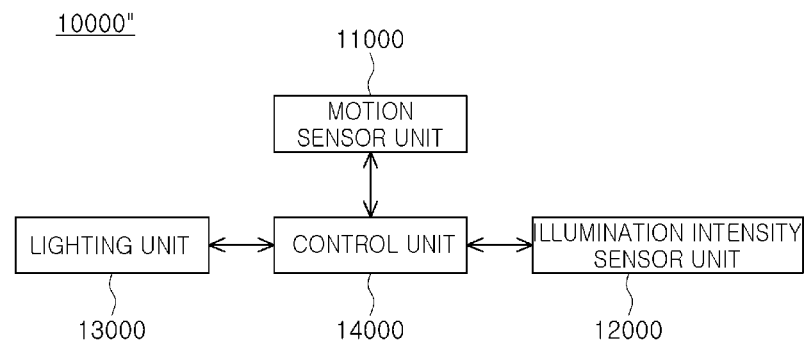
FIG. 34 is a block diagram schematically illustrating components of a lighting system according to another exemplary embodiment of the present application.

FIG. 34 is a block diagram schematically illustrating constituent elements of a lighting system according to another embodiment of the present application. A lighting system 10000" according to the present embodiment may include a motion sensor unit 11000, an illumination intensity sensor unit 12000, a lighting unit 13000, and a control unit 14000.

The motion sensor unit 11000 senses a motion of an object. For example, the lighting system may be attached to a movable object, such as, for example, a container or a vehicle, and the motion sensor unit 11000 senses a motion of the moving object. When the motion of the object to which the lighting system is attached is sensed, the motion sensor unit 11000 outputs a signal to the control unit 14000 and the lighting system is activated. The motion sensor unit 11000 may include an accelerometer, a geomagnetic sensor, or the like.

The illumination intensity sensor unit 12000, a type of optical sensor, measures an intensity of illumination of a surrounding environment. When the motion sensor unit 11000 senses the motion of the object to which the lighting system is attached, the illumination intensity sensor unit 12000 is activated according to a signal output by the control unit 14000. The lighting system illuminates during night work or in a dark environment to call a worker or an operator's attention to their surroundings, and allows a driver to secure visibility at night. Thus, even when the motion of the object to which the lighting system is attached is sensed, if an intensity of illumination higher than a predetermined level is secured (during the day), the lighting system is not required to illuminate. Also, even in the daytime, if it rains, the intensity of illumination may be fairly low, so there is a need to inform a worker or an operator about a movement of a container, and thus, the lighting unit is required to emit light. Thus, whether to turn on the lighting unit 13000 is determined according to an illumination intensity value measured by the illumination intensity sensor unit 12000.

The illumination intensity sensor unit 12000 measures an intensity of illumination of a surrounding environment and outputs the measured value to the control unit 14000. Meanwhile, when the illumination intensity value is equal to or higher than a pre-set value, the lighting unit 13000 is not required to emit light, so the overall system is terminated.

When the illumination intensity value measured by the illumination intensity sensor unit 12000 is lower than the pre-set value, the lighting unit 13000 emits light. The worker or the operator may recognize the light emissions from the lighting unit 1300 to recognize the movement of the container, or the like. As the lighting unit 13000, the foregoing lighting device may be employed.

Also, the lighting unit 13000 may adjust intensity of light emissions thereof according to the illumination intensity value of the surrounding environment. When the illumination intensity value of the surrounding environment is low, the lighting unit 13000 may increase the intensity of light emissions thereof, and when the illumination intensity value of the surrounding environment is relatively high, the lighting unit 13000 may decrease the intensity of light emissions thereof, thus preventing power wastage.

The control unit 14000 controls the motion sensor unit 1100, the illumination intensity sensor unit 12000, and the lighting unit 13000 overall. When the motion sensor unit 11000 senses the motion of the object to which the lighting system is attached, and outputs a signal to the control unit 14000, the control unit 14000 outputs an operation signal to the illumination intensity sensor unit 12000. The control unit 14000 receives an illumination intensity value measured by the illumination intensity sensor unit 12000 and determines whether to turn on (operate) the lighting unit 13000.

Figure 35:
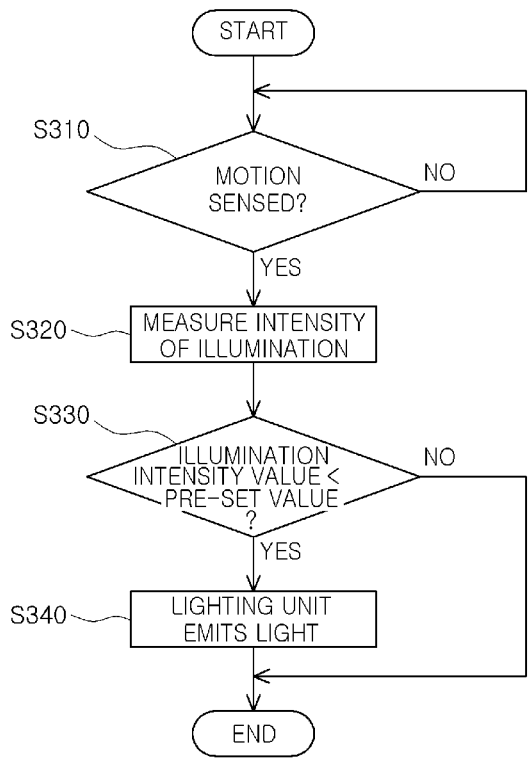
FIG. 35 is a flow chart illustrating a method for controlling a lighting system according to an exemplary embodiment of the present application.

FIG. 35 is a flowchart illustrating a method for controlling a lighting system. Hereinafter, a method for controlling a lighting system will be described with reference to FIG. 35.

First, a motion of an object to which the lighting system is attached is sensed and an operation signal is output (S310). For example, the motion sensor unit 11000 may sense a motion of a container or a vehicle in which the lighting system is installed, and when the motion of the container or the vehicle is sensed, the motion sensor unit 11000 outputs an operation signal. The operation signal may be a signal for activating overall power. Namely, when the motion of the container or the vehicle is sensed, the motion sensor unit 11000 outputs the operation signal to the control unit 14000.

Next, based on the operation signal, an intensity of illumination of a surrounding environment is measured and an illumination intensity value is output (S320). When the operation signal is applied to the control unit 14000, the control unit 14000 outputs a signal to the illumination intensity sensor unit 12000, and then the illumination intensity sensor unit 12000 measures the intensity of illumination of the surrounding environment. The illumination intensity sensor unit 12000 outputs the measured illumination intensity value of the surrounding environment to the control unit 14000. Thereafter, whether to turn on the lighting unit is determined according to the illumination intensity value and the lighting unit emits light according to the determination.

First, the illumination intensity value is compared with a pre-set value for a determination (S330). When the illumination intensity value is input to the control unit 14000, the control unit 14000 compares the received illumination intensity value with a stored pre-set value and determines whether the former is lower than the latter. Here, the pre-set value is a value for determining whether to turn on the lighting device. For example, the pre-set value may be an illumination intensity value at which a worker or a driver may have difficulty in recognizing an object with the naked eye or may make a mistake in a situation, for example, a situation in which the sun starts to set.

When the illumination intensity value measured by the illumination intensity sensor unit 12000 is higher than the pre-set value, lighting of the lighting unit is not required, so the control unit 14000 shuts down the overall system.

Meanwhile, when the illumination intensity value measured by the illumination intensity sensor unit 12000 is lower than the pre-set value, lighting of the lighting unit is required, so the control unit 14000 outputs a signal to the lighting unit 13000 and the lighting unit 13000 emits light (S340).

Figure 36:
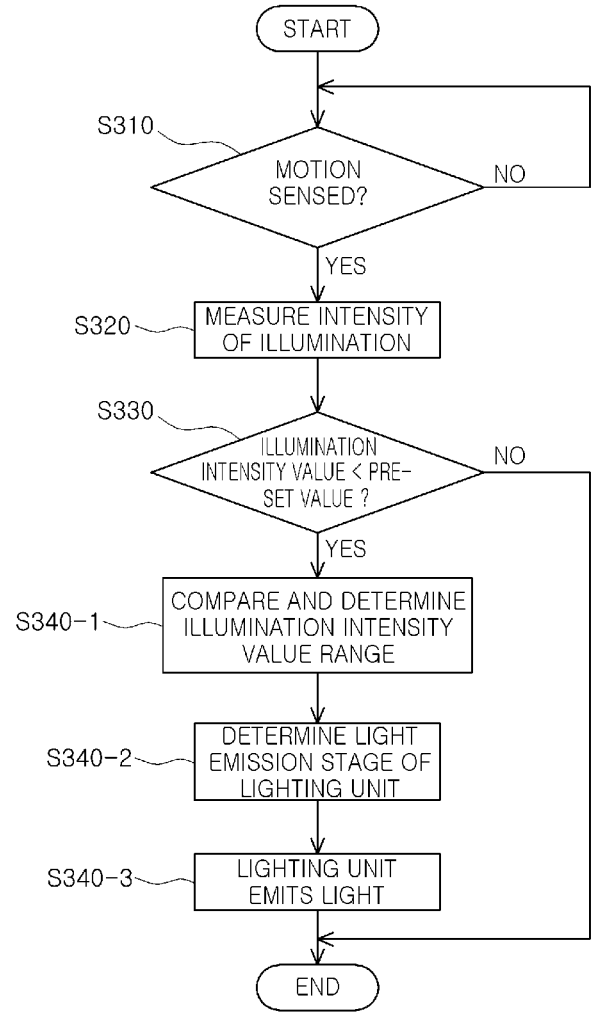
FIG. 36 is a flow chart illustrating a method for controlling a lighting system according to another exemplary embodiment of the present application.

FIG. 36 is a flowchart illustrating a method for controlling a lighting system according to another embodiment of the present invention. Hereinafter, a method for controlling a lighting system according to another embodiment of the present application will be described. However, the same procedure as that of the method for controlling a lighting system as described above with reference to FIG. 35 will be omitted.

As illustrated in FIG. 36, in the case of the method for controlling a lighting system according to the present embodiment, an intensity of light emissions of the lighting unit may be regulated according to an illumination intensity value of a surrounding environment.

As described above, the illumination intensity sensor unit 12000 outputs an illumination intensity value to the control unit 14000 (S320). When the illumination intensity value is lower than a pre-set value (S330), the control unit 14000 determines a range of the illumination intensity value (S340-1). The control unit 14000 has a range of subdivided illumination intensity value, based on which the control unit 14000 determines the range of the measured illumination intensity value.

Next, when the range of the illumination intensity value is determined, the control unit 14000 determines an intensity of light emissions of the lighting unit (S340-2), and accordingly, the lighting unit 13000 emits light (S340-3). The intensity of light emissions of the lighting unit may be divided according to the illumination intensity value, and here, the illumination intensity value varies according to weather, time, and surrounding environment, so the intensity of light emissions of the lighting unit may also be regulated. By regulating the intensity of light emissions according to the range of the illumination intensity value, power wastage may be prevented and a worker or an operator's attention may be drawn to their surroundings.

Figure 37:
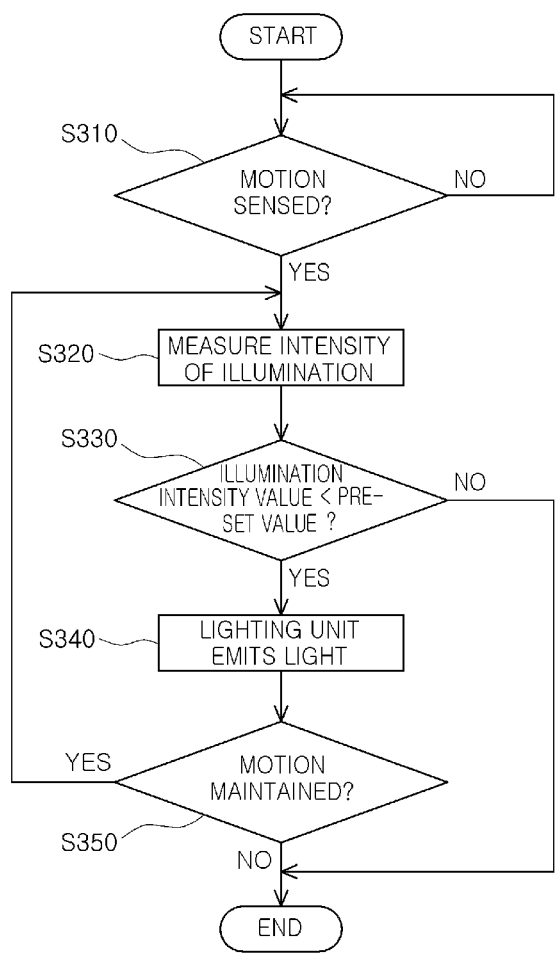
FIG. 37 is a flow chart illustrating a method for controlling a lighting system according to another exemplary embodiment of the present application.

FIG. 37 is a flowchart illustrating a method for controlling a lighting system according to another embodiment of the present application. Hereinafter, a method for controlling a lighting system according to another embodiment of the present application will be described. However, the same procedure as that of the method for controlling a lighting system as described above with reference to FIGS. 35 and 36 will be omitted.

The method for controlling a lighting system according to the present embodiment further includes operation S350 of determining whether a motion of an object to which the lighting system is attached is maintained in a state in which the lighting unit 13000 emits light, and determining whether to maintain light emissions.

First, when the lighting unit 13000 starts to emit light, termination of the light emissions may be determined based on whether a container or a vehicle to which the lighting system is installed moves. Here, when the motion of the container is stopped, it may be determined that an operation thereof has terminated. In addition, when a vehicle temporarily stops at a crosswalk, light emissions of the lighting unit may be stopped to prevent interference with the vision of oncoming drivers.

When the container or the vehicle moves again, the motion sensor unit 11000 operates and the lighting unit 14000 may start to emit light.

Whether to maintain light emissions may be determined based on whether a motion of an object to which the lighting system is attached is sensed by the motion sensor unit 11000. When the motion of the object is continuously sensed by the motion sensor unit 11000, an intensity of illumination is measured again and whether to maintain light emissions is determined. Meanwhile, when the motion of the object is not sensed, the system is terminated.

The lighting device using an LED as described above may be altered in terms of an optical design thereof according to a product type, a location, and a purpose. For example, in relation to the foregoing sensitivity illumination, a technique for controlling lighting by using a wireless (remote) control technique utilizing a portable device such as a smartphone, in addition to a technique of controlling a color, temperature, brightness, and a hue of illumination (or lighting) may be provided.

Also, in addition, a visible wireless communications technology aimed at achieving a unique purpose of an LED light source and a purpose as a communications unit by adding a communications function to LED lighting devices and display devices may be available. This is because, an LED light source advantageously has a longer lifespan and excellent power efficiency, implements various colors, supports a high switching rate for digital communications, and is available for digital control, in comparison to existing light sources.

The visible light wireless communications technology is a wireless communications technology transferring information wirelessly by using light having a visible light wavelength band recognizable by humans' eyes. The visible light wireless communications technology is discriminated from a wired optical communications technology in the aspect that it uses light having a visible light wavelength band, and discriminated from a wired optical communications technology in the aspect that a communications environment is based on a wireless scheme.

Also, unlike RF wireless communications, the visible light wireless communications technology has excellent convenience and physical security properties in that it can be freely used without being regulated or permitted in the aspect of frequency usage, is differentiated in that a user can check a communications link with his/her eyes, and above all, the visible light wireless communications technology has features as a fusion technique (or converging technology) obtaining a unique purpose as a light source and a communications function.

As set forth above, according to embodiments of the present invention, the light source module which increases a light distribution angle to 180° or greater and emits light having a range substantially equal to that of the conventional fluorescent lamp when employed in a lighting fixture or lighting equipment, and a lighting device having the same can be provided.

Advantages and effects of the present application are not limited to the foregoing content and any other technical effects not mentioned herein may be easily understood by a person skilled in the art from the foregoing description.

While the present application has been shown and described in connection with the embodiments, it will be apparent to those skilled in the art that modifications and variations can be made without departing from the spirit and scope of the invention as defined by the appended claims.

What is claimed is:

1. A light source module comprising:
a substrate;
a plurality of light emitting devices disposed along a line on the substrate; and
a lens extending in a long-axis direction in which the plurality of light emitting devices are aligned, to cover the substrate and the plurality of light emitting devices, and having end sides opened at opposing ends of the lens in the long-axis direction,
wherein the lens has a first surface to which light from the plurality of light emitting devices is made incident and a second surface allowing light made incident through the first surface to be radiated outwardly,
wherein the lens has a variable thickness, measured as a distance between the first surface and the second surface, in a cross-section of the lens along a plane orthogonal to the long-axis direction, and
wherein the thickness of the lens in the cross-section of the lens along the plane orthogonal to the long-axis direction decreases from a center of the lens toward both lateral sides of the lens.

2. The light source module of claim 1, wherein the thickness in the center of the lens is greater than the thickness in both lateral sides thereof by n times where $1 < n \leq 2$.

3. The light source module of claim 1, wherein the lens is shaped such that both lateral sides thereof are parallel in the long-axis direction along which the plurality of light emitting devices are aligned, and portions of the lens connecting both lateral sides have a concave first surface and a convex second surface.

4. The light source module of claim 1, wherein each light emitting device comprises:
a light emitting laminate including a first conductivity-type semiconductor layer, an active layer, and a second conductivity-type semiconductor layer; and
first and second electrodes electrically connected to the first and second conductivity-type semiconductor layers, respectively,
wherein the first electrode includes a conductive via connected to the first conductivity-type semiconductor layer through the second conductivity-type semiconductor layer and the active layer.

5. The light source module of claim 1, wherein each lighting device comprises a plurality of nano-light emitting structures and a filler material filling spaces between the plurality of nano-light emitting structures,
wherein each nano-light emitting structure includes a nano-core as a first conductivity-type semiconductor layer and an active layer and a second conductivity-type semiconductor layer as shell layers covering the nano-core.

6. The light source module of claim 1, wherein each lighting device emits white light by combining a yellow, green, red, or orange phosphor with a blue LED, and a color rendering index (CRI) of white light ranges from a sodium-vapor lamp (CRI: 40) to a sunlight level (CRI: 100).

7. The light source module of claim 1, wherein each light emitting device emits white light by combining yellow, green, or red phosphors to a blue LED, and white light is positioned in a segment linking (x, y) coordinates (0.4476, 0.4074), (0.3484, 0.3516), (0.3101, 0.3162), (0.3128, 0.3292), (0.3333, 0.3333) of a CIE 1931 chromaticity diagram, or is positioned in a region surrounded by a spectrum of black body radiation, and a color temperature of white light ranges from 2000K to 20000K.

8. A lighting device comprising:
a light source module including a substrate, a plurality of light emitting devices aligned on the substrate, and a lens extending in a long-axis direction in which the plurality of light emitting devices are aligned, wherein the lens covers the substrate and the plurality of light emitting devices and has end sides that are opened at ends of the lens in the long-axis direction;
a body unit to which the light source module is fixed; and
terminal units provided in two end portions of the body unit and configured to receive externally supplied power,
wherein the lens has a first surface to which light from the plurality of light emitting devices is made incident and a second surface allowing light made incident through the first surface to be radiated outwardly,
wherein the lens has a variable thickness, measured as a distance between the first surface and the second surface, in a cross-section of the lens along a plane orthogonal to the long-axis direction, and
wherein the thickness of the lens in the cross-section of the lens along the plane orthogonal to the long-axis direction decreases from a center of the lens toward both lateral sides of the lens.

9. The lighting device of claim 8, wherein the body unit has stoppage recesses for detachably fastening the lens, and the stoppage recesses are formed on one surface of the body unit to which the light source module is fixed.

10. The lighting device of claim 8, further comprising:
a cover unit in which the body unit is insertedly fixed.

11. The lighting device of claim 10, wherein the cover unit has a plurality of guides protruding from an inner surface of the cover unit to contact with the body unit, and
the plurality of guides are slidably inserted into guide recesses formed on an outer surface of the body unit.

12. The lighting device of claim 10, wherein the cover unit has a cross-section having a circular shape and extends in the long-axis direction of the light source module and the body unit to accommodate the light source module and the body unit therein.

13. The lighting device of claim 8, further comprising:
a cover unit having a semi-circular cross-section and extending in the long-axis direction of the light source module and the body unit,
wherein the cover unit is configured to be fixed to the body unit and to cover the body unit.

14. The lighting device of claim 8, wherein the cover unit includes a plurality of heat dissipation slits or heat dissipation holes formed in portions of the cover unit facing the body unit and penetrating through the cover unit.

15. A light source module comprising:
a substrate;
a plurality of light emitting devices aligned on the substrate; and
a lens extending in a long-axis direction in which the plurality of light emitting devices are aligned, to cover the substrate and the plurality of light emitting devices,
wherein the lens has cross-section taken along a plane orthogonal to the long-axis direction including:
two lateral sides that are parallel to each other and disposed on opposite sides of the aligned plurality of light emitting devices; and
an arched portion connecting the two lateral sides and having a concave inner surface facing the plurality of light emitting devices,
wherein the concave inner surface is disposed at a distance R, from a central point on a surface of a light emitting device facing the inner surface, that decreases from a center of the arched portion towards each of the two lateral sides.

16. The light source module of claim 15, wherein the arched portion of the lens has a convex outer surface facing away from the plurality of light emitting devices, and wherein a thickness of the arched portion decreases from the center of the arched portion towards each of the two lateral sides.

17. The light source module of claim 16, wherein the lens further comprises a concavo-convex structure formed on at least one of the concave inner surface and the convex outer surface.

* * * * *